(12) United States Patent
Lee et al.

(10) Patent No.: US 9,287,346 B2
(45) Date of Patent: Mar. 15, 2016

(54) SEMICONDUCTOR DEVICE

(71) Applicant: Samsung Electronics Co., Ltd., Suwon-Si, Gyeonggi-Do (KR)

(72) Inventors: Jeong-Yun Lee, Yongin-si (KR); Moo-Jin Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 115 days.

(21) Appl. No.: 13/749,003

(22) Filed: Jan. 24, 2013

(65) Prior Publication Data

US 2013/0193556 A1 Aug. 1, 2013

(30) Foreign Application Priority Data

Jan. 26, 2012 (KR) ........................ 10-2012-0007471

(51) Int. Cl.
*H01L 49/02* (2006.01)
*H01L 27/07* (2006.01)
*H01L 27/06* (2006.01)

(52) U.S. Cl.
CPC ............ *H01L 28/40* (2013.01); *H01L 27/0688* (2013.01); *H01L 27/0794* (2013.01)

(58) Field of Classification Search
CPC .. H01L 23/5523; H01L 27/0805; H01L 28/40
USPC ........................................................ 257/532
See application file for complete search history.

(56) References Cited

U.S. PATENT DOCUMENTS

| | | | | |
|---|---|---|---|---|
| 6,156,602 A * | 12/2000 | Shao et al. | | 438/238 |
| 6,274,424 B1 * | 8/2001 | White et al. | | 438/239 |
| 6,313,516 B1 * | 11/2001 | Tsui et al. | | 257/538 |
| 7,026,662 B2 | 4/2006 | Song | | |
| 7,214,963 B2 * | 5/2007 | Choi et al. | | 257/67 |
| 7,247,580 B2 | 7/2007 | Kim | | |
| 7,332,796 B2 | 2/2008 | Kim | | |
| 2006/0145183 A1 | 7/2006 | Song | | |
| 2006/0246654 A1 * | 11/2006 | Shin | | 438/238 |
| 2009/0294820 A1 * | 12/2009 | Ostermayr et al. | | 257/306 |

FOREIGN PATENT DOCUMENTS

| | | |
|---|---|---|
| JP | 2000216137 A | 8/2000 |
| JP | 2004140219 A | 5/2004 |
| JP | 2004282069 A | 10/2004 |

(Continued)

OTHER PUBLICATIONS

Yunogami, Takashi et al. "Radiation Damage in SiO2/Si Induced" by VUV Photons, vol. 28, No. 10, Oct. 1989, pp. 2172-2176.

*Primary Examiner* — Matthew W Such
*Assistant Examiner* — Warren H Kilpatrick
(74) *Attorney, Agent, or Firm* — Harness, Dickey & Pierce, P.L.C.

(57) ABSTRACT

A semiconductor device includes a semiconductor substrate having a capacitor region and a resistor region. A capacitor dielectric material and a capacitor electrode are sequentially stacked on an active region in the capacitor region of the semiconductor substrate. A resistor is provided on the resistor region of the semiconductor substrate. A protection pattern is provided on a top surface of the capacitor electrode. The protection pattern is spaced apart from the capacitor electrode. The protection pattern and the resistor include the same material and have the same thickness in a direction vertical to a surface of the semiconductor substrate.

19 Claims, 25 Drawing Sheets

(56) References Cited

FOREIGN PATENT DOCUMENTS

| JP | 2005167069 | A | 6/2005 |
|----|------------|---|--------|
| JP | 2005197741 | A | 7/2005 |
| KR | 20050069323 | A | 7/2005 |
| KR | 10-0574939 | B1 | 4/2006 |
| KR | 10-0871354 | B1 | 12/2008 |

* cited by examiner

SEMICONDUCTOR DEVICE

CROSS-REFERENCE TO RELATED APPLICATION

This application claims priority under 35 U.S.C. §119 to Korean Patent Application No. 10-2012-0007471 filed on Jan. 26, 2012, the disclosure of which is hereby incorporated by reference in its entirety.

BACKGROUND

1. Field

Some example embodiments relate to a semiconductor device, a method of fabricating the same, and/or an electronic apparatus and electronic system adopting the semiconductor device.

2. Description of Related Art

Research into methods for improving the reliability of components of a semiconductor device has been conducted.

SUMMARY

Some example embodiments provide a semiconductor device including a dielectric material and a conductive pattern sequentially stacked on an active region, which may improve reliability of the dielectric material.

Other example embodiments provide a method of fabricating a semiconductor device including a dielectric material and a conductive pattern sequentially stacked on an active region to improve reliability of the dielectric material.

Other example embodiments provide an electronic apparatus and electronic system having the semiconductor devices.

The inventive concepts should not be limited by the above description, and other unmentioned aspects will be clearly understood by one of ordinary skill in the art from example embodiments described herein.

In accordance with an example embodiment, a semiconductor device is provided. The device includes a semiconductor substrate having a capacitor region and a resistor region. A capacitor dielectric material and a capacitor electrode are sequentially stacked on an active region of the capacitor region of the semiconductor substrate. A resistor is on the resistor region of the semiconductor substrate. A protection pattern is on a top surface of the capacitor electrode and spaced apart from the capacitor electrode. The protection pattern and the resistor include the same material and have the same thickness in a direction vertical to a surface of the semiconductor substrate.

The semiconductor device may further include a lower insulating layer under the protection pattern and the resistor to cover the capacitor electrode, and an upper insulating layer on the lower insulating layer to cover the protection pattern and the resistor.

The lower insulating layer may cover a bottom surface of the protection pattern, and the upper insulating layer may cover top and side surfaces of the protection pattern so that the protection pattern may electrically float.

The lower insulating layer may include a first insulating layer, a second insulating layer, and a third insulating layer stacked sequentially, and the second insulating layer may include a different insulating material from the first and third insulating layers.

A top surface of the resistor may be at a lower level than the top surface of the capacitor electrode. The protection pattern may have a greater width than the resistor. The protection pattern may include a first portion covering the top surface of the capacitor electrode, and a second portion extending from the first portion over the semiconductor substrate adjacent to the capacitor electrode.

The protection pattern may include a first portion vertically overlapping the top surface of the capacitor electrode, a second portion over the semiconductor substrate adjacent to the capacitor electrode, and a third portion configured to connect the first and second portions and horizontally overlap a side surface of the capacitor electrode.

The capacitor electrode may include a lower conductive pattern and an upper conductive pattern on the lower conductive pattern, and the upper conductive pattern may have a greater planar area than the lower conductive pattern.

The semiconductor device may further include an insulating pattern in the semiconductor substrate having the capacitor region and the resistor region. The insulating pattern may define the active region of the capacitor region in the capacitor region and may be under the resistor in the resistor region.

The capacitor electrode may include a lower conductive pattern and an upper conductive pattern stacked sequentially. The lower conductive pattern may have a side surface vertically aligned with a side surface of the active region. The upper conductive pattern may include a first portion covering the lower conductive pattern, and a second portion vertically overlapping the insulating pattern adjacent to the lower conductive pattern.

In accordance with another example embodiment, a semiconductor device is provided. The device includes an insulating pattern provided in a semiconductor substrate and defines an active region. A dielectric material and a conductive pattern are sequentially stacked on the active region. A lower insulating layer is over a portion of the semiconductor substrate having the insulating pattern and the conductive pattern. A first silicon pattern is on the lower insulating layer. The first silicon pattern vertically overlaps a top surface of the conductive pattern. A second silicon pattern is on the lower insulating layer. The second silicon pattern is spaced apart from the first silicon pattern. An upper insulating layer is on the lower insulating layer and covers the first and second silicon patterns. A first interconnection is on the upper insulating layer and electrically connected to the conductive pattern. A second interconnection is on the upper insulating layer and electrically connected to the second silicon pattern. The first and second silicon patterns have the same thickness in a direction vertical to a surface of the semiconductor substrate.

A top surface of the second silicon pattern may be disposed at a lower level than a bottom surface of the first silicon pattern. The first silicon pattern may be a pattern encapsulated by the lower and upper insulating layers so as to be electrically floated. The lower insulating layer may include non-plasma oxide, and the upper insulating layer may include plasma oxide.

In accordance with another example embodiment, a semiconductor device is provided. The device includes a semiconductor substrate including first and second regions, a dielectric material and a conductive pattern sequentially stacked on the first region of the semiconductor substrate, a first semiconductor pattern on a top surface of the conductive pattern and spaced apart from the conductive pattern, and a second semiconductor pattern on the second region of the semiconductor substrate. The first semiconductor pattern has a first width, and the second semiconductor pattern has a second width less than the first width.

The first and second semiconductor patterns may include the same material (e.g., polycrystalline silicon). The first and second semiconductor patterns may have the same thickness in a direction vertical to a surface of the semiconductor substrate. A top surface of the second semiconductor pattern may be at a lower level than a bottom surface of the first semiconductor pattern.

Specific particulars of other example embodiments are included in detailed descriptions and drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EXAMPLE EMBODIMENTS

Figure 1:
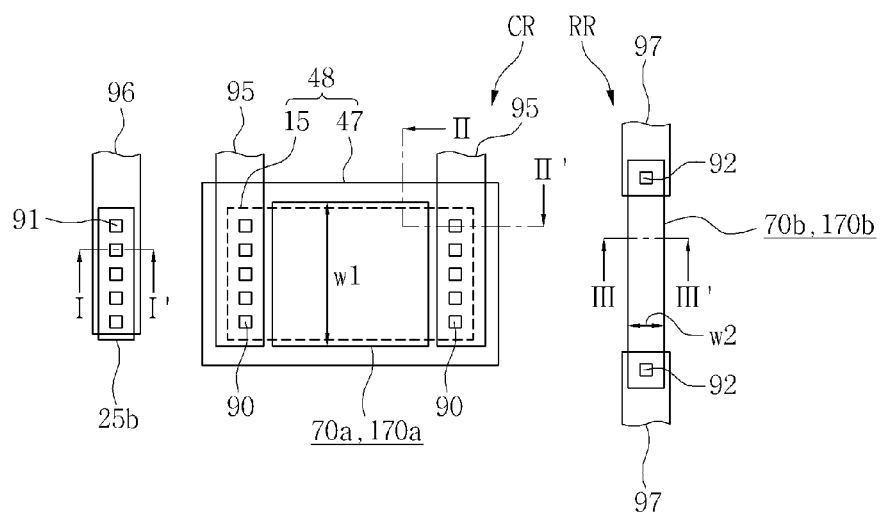
FIG. 1 is a plan view of a semiconductor device according to an example embodiment of the inventive concepts.

The inventive concepts will now be described more fully hereinafter with reference to the accompanying drawings, in which example embodiments of the inventive concepts are shown. This inventive concepts may, however, be embodied in different forms and should not be construed as limited to example embodiments set forth herein. Rather, these example embodiments are provided so that this disclosure is thorough and complete and fully conveys the scope of the inventive concepts to one skilled in the art. In the drawings, the sizes and relative sizes of layers and regions are exaggerated for clarity. Like numbers refer to like element throughout.

Example embodiments of the inventive concepts are described herein with reference to cross-section, plan, and block illustrations that are schematic illustrations of idealized embodiments of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concepts.

It will also be understood that when a layer is referred to as being "on" another layer or substrate, it can be directly on the other layer or substrate or intervening layers may also be present.

Spatially relative terms, such as "top end", "bottom end", "top surface", "bottom surface", "upper", "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of lower and upper. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concepts.

The terminology used herein is for the purpose of describing particular embodiments only and is not intended to be limiting of the inventive concepts.

It will be understood that, although terms, such as a term "protection", may be used herein to describe various elements, components, regions, layers and/or sections, these elements, components, regions, layers and/or sections should not be limited by these terms. These terms are only used to distinguish one element, component, region, layer or section from another region, layer or section. Thus, a protection element, component, region, layer or section discussed below could be termed a first element, component, region, layer or section without departing from the teachings of the present invention.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2A:
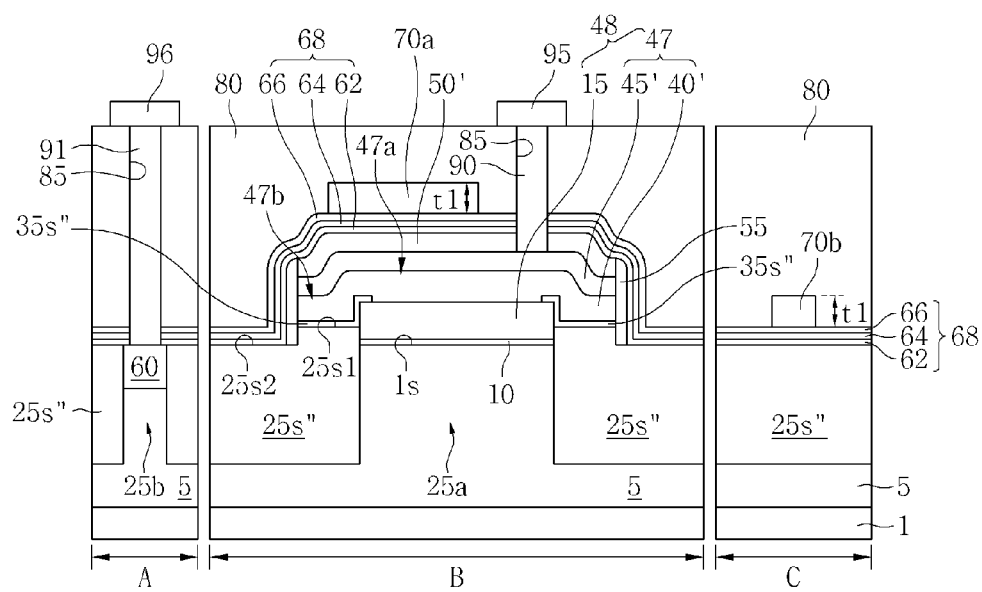
FIG. 2A is a cross-sectional view of a semiconductor device according to an example embodiment of the inventive concepts.

FIG. 1 is a plan view of a semiconductor device according to an example embodiment of the inventive concepts, and FIG. 2A is a cross-sectional view of a semiconductor device according to an example embodiment of the inventive concepts. In FIG. 2A, portion "A" is a region taken along line I-I' of FIG. 1, portion "B" is a region taken along line II-II' of FIG. 1, and portion "C" is a region taken along line III-III' of FIG. 1.

The semiconductor device according to the present embodiment of the inventive concepts will now be described with reference to FIGS. 1 and 2A.

Referring to FIGS. 1 and 2A, a substrate 1 having a first region CR and a second region RR may be provided. The substrate 1 may be a semiconductor substrate. The substrate 1 may be a silicon substrate. The first region CR may be a first circuit region, and the second region RR may be a second circuit region. For example, the first region CR may be a capacitor region where a capacitor may be formed, and the second region RR may be a resistor region where a resistor may be formed. A well region 5 may be provided in the substrate 1. The well region 5 may have an N conductivity type or a P conductivity type.

An insulating pattern 25s" defining active regions may be provided in the substrate 1. The active regions may include a first active region 25a and a second active region 25b provided in the first region CR. The insulating pattern 25s" may be interposed between the first and second active regions 25a and 25b so that the first and second active regions 25a and 25b may be spaced apart from each other. The well region 5 may be formed in the first and second active regions 25a and 25b and also formed in the substrate 1 disposed under the first active region 25a, in the substrate 1 disposed under the second active region 25b, and in the substrate 1 disposed under the insulating pattern 25s" between the first and second active regions 25a and 25b.

An impurity region 60 may be provided in an upper region of the second active region 25b. The impurity region 60 may have the same conductivity type as the well region 5. For example, the impurity region 60 and the well region 5 may have a P conductivity type. Alternatively, the impurity region 60 and the well region 5 may have an N conductivity type.

The insulating pattern 25s" may include silicon oxide that may fill a trench 23 formed in the substrate 1. The insulating pattern 25s" may have a top surface having a step difference. For instance, a portion of the insulating pattern 25s" adjacent to the active region 25a may have a first top surface 25s1, while the remaining portion of the insulating pattern 25s" may have a second top surface 25s2 which is at a lower level than the first top surface 25s1.

A dielectric material 10 and a lower conductive pattern 15 may be sequentially stacked on the first active region 25a in the first region CR. When the first region CR is the capacitor region, the dielectric material 10 may be a capacitor dielectric material 10. The lower conductive pattern 15 may be formed of polysilicon (poly-Si).

An upper conductive pattern 47 may be provided on the lower conductive pattern 15. A capping pattern 50' may be provided on the upper conductive pattern 47. The capping pattern 50' may be formed of an insulating material, such as silicon oxide or silicon nitride.

The upper conductive pattern 47 may be in contact with or electrically connected to the lower conductive pattern 15. The upper conductive pattern 47 may have a greater planar area than the lower conductive pattern 15. The upper conductive pattern 47 may have a greater width than the lower conductive pattern 15. The upper conductive pattern 47 may cover the lower conductive pattern 15 and extend to cover the first top surface 25s1 of the insulating pattern 25s". The upper conductive pattern 47 may prevent or inhibit direct collision of ions generated during a plasma process with the dielectric material 10, and degradation of the dielectric material 10.

The upper conductive pattern 47 may include a first portion 47a vertically overlapping the lower conductive pattern 15, and a second portion 47b vertically overlapping the insulating pattern 25s" adjacent to the lower conductive pattern 15. The first portion 47a of the upper conductive pattern 47 may cover the lower conductive pattern 15. The second portion 47b of the upper conductive pattern 47 may cover the first top surface 25s1 of the insulating pattern 25s".

The upper conductive pattern 47 may include a first pattern 40' and a second pattern 45' stacked sequentially. The first pattern 40' may be formed of poly-Si, while the second pattern 45' may be formed of a metal material having a lower resistivity than the first pattern 40', for example, a metal such as tungsten (W).

The first top surface 25s1 of the insulating pattern 25s" may be disposed under the first pattern 40' of the upper conductive pattern 47, and the second top surface 25s2 thereof may be disposed adjacent to the upper conductive pattern 47. The first top surface 25s1 of the insulating pattern 25s" may be disposed at a lower level than a top surface of the lower conductive pattern 15, and the second top surface 25s2 thereof may be disposed at a lower level than the first top surface 25s1.

A dielectric pattern 35" may be interposed between the first pattern 40' of the upper conductive pattern 47 and the first top surface 25s1 of the insulating pattern 25s". The dielectric pattern 35" may extend between the first pattern 40' and the lower conductive pattern 15. The dielectric pattern 35" may extend between the first pattern 40' and the lower conductive pattern 15, and cover a portion of the top surface of the lower conductive pattern 15. The dielectric pattern 35" may function to prevent or inhibit an electrical short or electrical interference between the upper conductive pattern 47 and the active region 25a.

Spacers 55 may be provided on sidewalls of the capping pattern 50' and the upper conductive pattern 47. The spacers 55 may cover the sidewalls of the capping pattern 50' and the upper conductive pattern 47 and extend to the second top surface 25s1 of the insulating pattern 25s". The spacers 55 may be formed of an insulating material, such as silicon oxide or silicon nitride.

The lower and upper conductive patterns 15 and 47 may constitute a conductive pattern 48. When the first region CR is the capacitor circuit region, the conductive pattern 48 may be a first capacitor electrode 48, and the portion of the first active region 25a adjacent to the lower conductive pattern 15 may be defined as a second capacitor electrode 25a. Accordingly, the first capacitor electrode 48, the second capacitor electrode 25a, and the capacitor dielectric material 10 interposed between the first and second capacitor electrodes 48 and 25a may constitute a capacitor.

A lower insulating layer 68 may be provided on the substrate 1 having the capacitor. The lower insulating layer 68 may cover the capping pattern 50', the spacers 55, the insulating pattern 25s", and the second active region 25b. The lower insulating layer 68 may include a plurality of layers. For example, the lower insulating layer 68 may include a first insulating layer 62, a second insulating layer 64, and a third insulating layer 66 stacked sequentially. The second insulating layer 64 may include a different material from the first and third insulating layers 62 and 66. The second insulating layer 64 may be formed of a material having an etch selectivity with respect to the first and third insulating layers 62 and 66. For instance, the first insulating layer 62 may be silicon oxide conformably formed on the substrate 1 having the spacers 55, and the second insulating layer 64 may be silicon nitride conformably formed on the first insulating layer 62. The third insulating layer 66 may be silicon oxide conformably formed on the second insulating layer 64.

A first semiconductor (e.g., first silicon) pattern 70a may be provided on the lower insulating layer 68 of the first region CR. A second semiconductor (e.g., second silicon) pattern 70b may be provided on the lower insulating layer 68 in the second region RR. The first semiconductor (e.g., first silicon) pattern 70a may be disposed on the conductive pattern 48 and spaced apart from the conductive pattern 48. The first and second semiconductor (e.g., second silicon) patterns 70a and 70b may include crystalline silicon, for example, poly-Si.

The first and second semiconductor (e.g., second silicon) patterns 70a and 70b may have substantially the same thickness in a direction vertical to a top surface 1s of the semiconductor substrate 1. For example, the first and second semiconductor (e.g., second silicon) patterns 70a and 70b may have a first thickness t1 in the direction vertical to the top surface 1s of the semiconductor substrate 1. The first semiconductor (e.g., first silicon) pattern 70a may overlap the conductive pattern 48. The first semiconductor (e.g., first silicon) pattern 70a may have a greater width than the second semiconductor (e.g., second silicon) pattern 70b. For example, the first semiconductor (e.g., first silicon) pattern 70a may have a first width W1, and the second semiconductor (e.g., second silicon) pattern 70b may have a second width W2 less than the first width W1.

The first semiconductor (e.g., first silicon) pattern 70a may be a protection pattern configured to protect the dielectric material 10 from ultraviolet (UV) light generated during a subsequent semiconductor process using plasma. The second semiconductor (e.g., second silicon) pattern 70b may be a resistor.

In example embodiments, to clarify the division of components, the first semiconductor (e.g., first silicon) pattern 70a is a protection pattern 70a, and the second semiconductor (e.g., second silicon) pattern 70b is a resistor 70b.

The protection pattern 70a may cut off most of UV light generated during a plasma process. Accordingly, since most of the UV light generated during the plasma process is cut off by the protection pattern 70a, UV light reaching the conductive pattern 48 cannot damage a device including the dielectric material 10 and the conductive pattern 48, for example, a dielectric material of the capacitor.

An upper insulating layer 80 may be provided on the substrate 1 having the protection pattern 70a and the resistor 70b. The upper insulating layer 80 may include plasma oxide. For instance, the upper insulating layer 80 may include high-density-plasma (HDP) oxide. The lower insulating layer 68 may include a non-plasma insulating material. For example, the lower insulating layer 68 may include non-plasma oxide and/or non-plasma nitride formed using a plasma-free method, for example, a chemical vapor deposition (CVD) process or an atomic layer deposition (ALD) process A first contact plug 90 may be provided within a hole 85, which may penetrate the upper insulating layer 80, the lower insulating layer 68, and the capping pattern 50'. The first contact plug 90 may be electrically connected to the upper conductive pattern 47.

A second contact plug 91 may be provided within a hole 85, which may penetrate the upper insulating layer 80 and the lower insulating layer 68. The second contact plug 91 may be electrically connected to the impurity region 60.

Third contact plugs 92 may be formed through the upper insulating layer 80 and electrically connected to the resistor 70b. The third contact plugs 92 may be in contact with both end portions of the resistor 70b and electrically connected to the resistor 70b.

First through third interconnections 95, 96, and 97 may be provided on the upper insulating layer 80. The first interconnection 95 may cover the first contact plug 90 and be electrically connected to the first contact plug 90. The second interconnection 96 may cover the second contact plug 91 and be electrically connected to the second contact plug 91. The third interconnections 97 may cover the third contact plugs 92 and be electrically connected to the third contact plugs 92.

In some example embodiments, a bottom surface of the protection pattern 70a may be covered with the lower insulating layer 68, while side and top surfaces thereof may be covered with the upper insulating layer 80. The protection pattern 70a may be surrounded by the lower and upper insulating layers 68 and 80 and electrically floated.

Figure 2B:
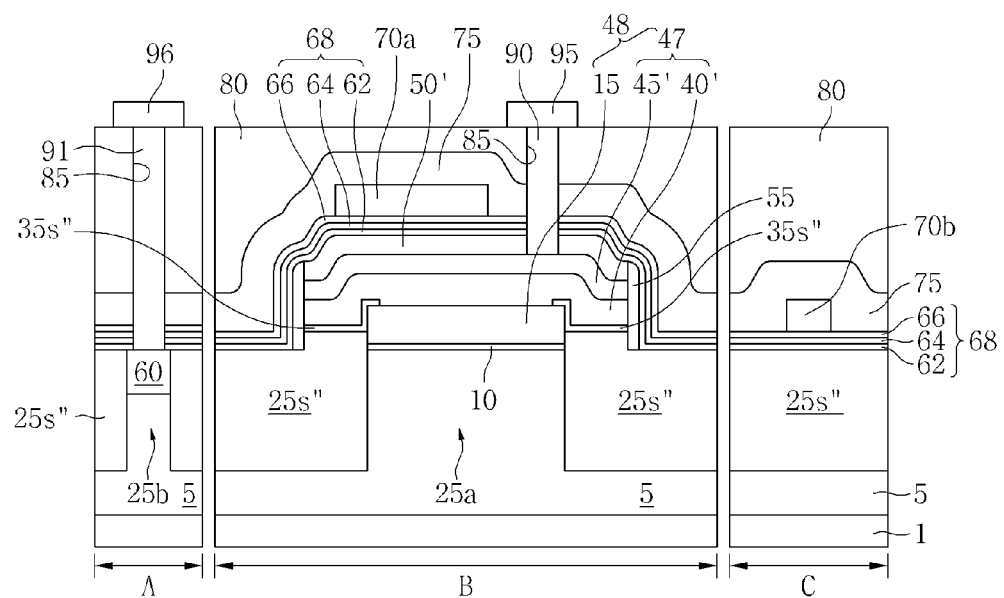
FIG. 2B is a cross-sectional view of a modified example of a semiconductor device according to an example embodiment of the inventive concepts.

Meanwhile, as shown in FIG. 2B, a buffer insulating layer 75 may be provided on the substrate 1 having the protection pattern 70a and the resistor 70b, and the upper insulating layer 80 may be provided on the buffer insulating layer 75. The buffer insulating layer 75 may cover the protection pattern 70a and the resistor 70b on the lower insulating layer 68. The buffer insulating layer 75 may include oxide (e.g., silicon oxide) formed using a non-plasma deposition process.

A modified example of a semiconductor device according to an example embodiment of the inventive concepts will be described with reference to FIG. 2C.

Figure 2C:
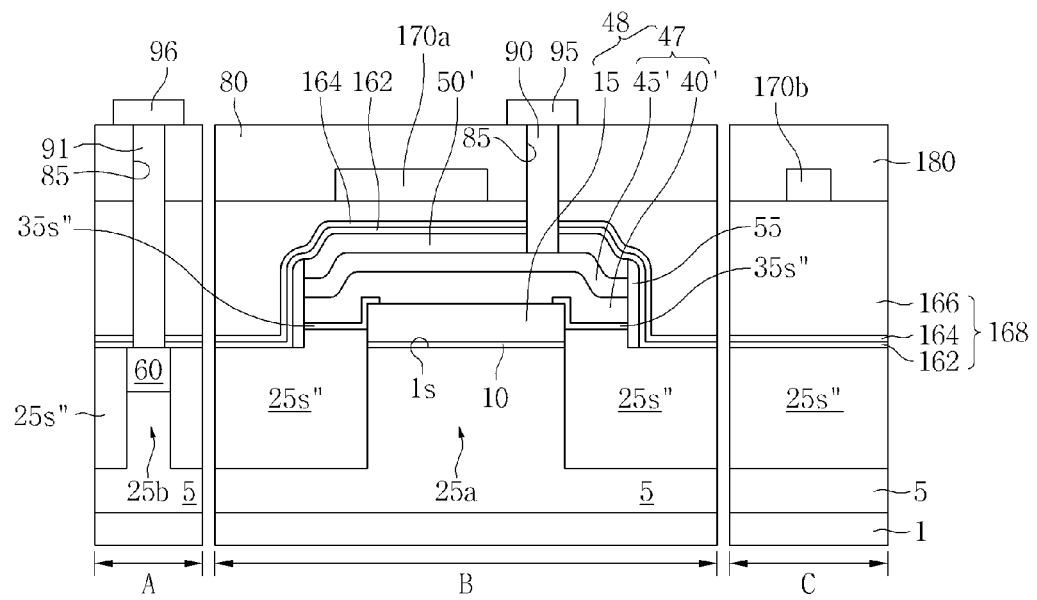
FIG. 2C is a cross-sectional view of another modified example of a semiconductor device according to an example embodiment of the inventive concepts.

Referring to FIGS. 1 and 2C, a substrate 1 having a capacitor may be provided as described with reference to FIG. 2A. A lower insulating layer 168 may be provided on the substrate 1 having the capacitor. The lower insulating layer 168 may include a first insulating layer 162, a second insulating layer 164, and a third insulating layer 166 stacked sequentially. The first insulating layer 162 may include an insulating layer conformably formed on the semiconductor substrate 1 having the capacitor, for example, a silicon oxide layer. The second insulating layer 164 may include an insulating layer conformably formed on the first insulating layer 162, for example, a silicon nitride layer. The third insulating layer 166 may include an insulating layer, which is thicker than the first and second insulating layers 162 and 164. The third insulating layer 166 may include a silicon oxide layer. The third insulating layer 166 may be an insulating layer having a substantially planar top surface. The lower insulating layer 168 may be an insulating layer having a substantially planar top surface. The lower insulating layer 168 may have a top surface disposed at a higher level than a top surface of the upper conductive pattern 47.

A protection pattern 170a and a resistive pattern 170b may be provided on the lower insulating layer 168. The protection pattern 170a and the resistor 170b may include the same material. The protection pattern 170a and the resistor 170b may be formed of poly-Si. The protection pattern 170a and the resistor 170b may have substantially the same thickness in the direction vertical to the top surface 1s of the semiconductor substrate 1.

The protection pattern 170a may be disposed on the conductive pattern 48 and spaced apart from the conductive pattern 48. The protection pattern 170a and the resistor 170b may be disposed at substantially the same level. The resistor 170b may be disposed at a higher level than the conductive pattern 48. An upper insulating layer 180 may be provided on the substrate 1 having the protection pattern 170a and the resistor 170b.

Similarly to FIG. 2A, the first contact plug 90 may be provided within the hole 85, which may penetrate the upper insulating layer 180, the lower insulating layer 168, and the capping pattern 50'. The first contact plug 90 may be electrically connected to the upper conductive pattern 47. The second contact plug 91 may be provided within the hole 85, which may penetrate the upper and lower insulating layers 180 and 168, and electrically connected to the impurity region 60. Third contact plugs 92 may be formed through the upper insulating layer 180 and electrically connected to the resistor 170b. First through third interconnections 95, 96, and 97, which are described with reference to FIG. 2A, may be provided on the upper insulating layer 180.

Figure 3:
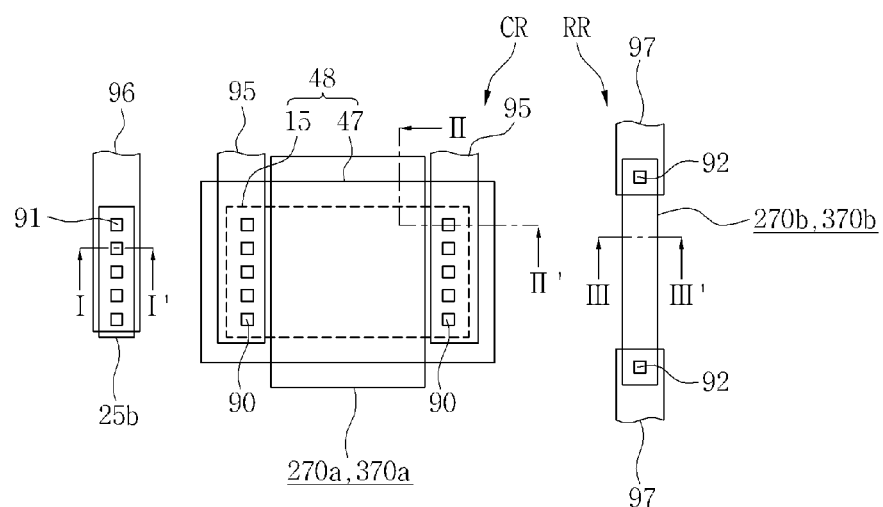
FIG. 3 is a plan view of another modified example of a semiconductor device according to an example embodiment of the inventive concepts.
Figure 4A:
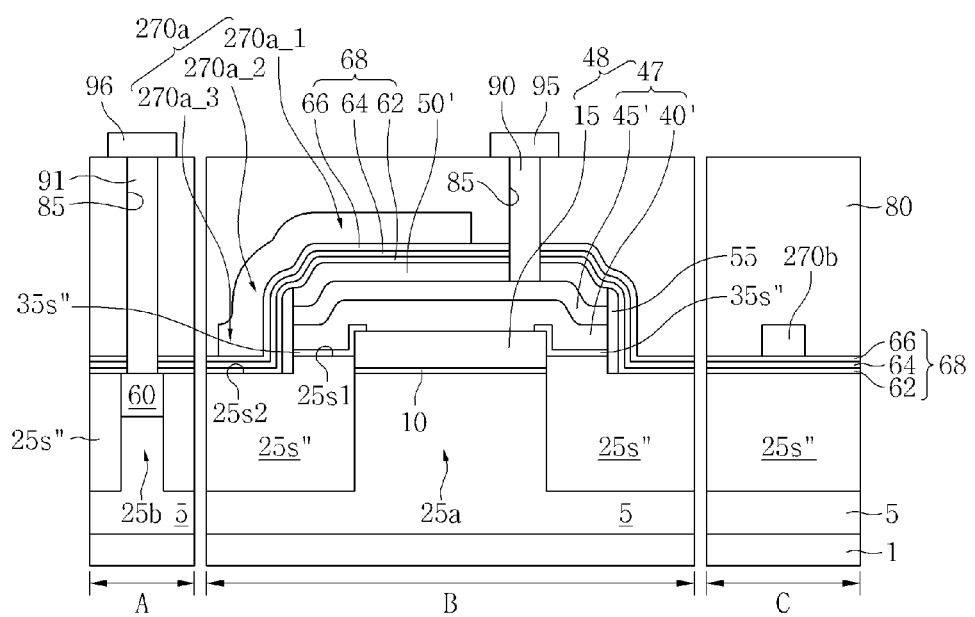
FIG. 4A is a cross-sectional view of another modified example of a semiconductor device according to an example embodiment of the inventive concepts.
Figure 4B:
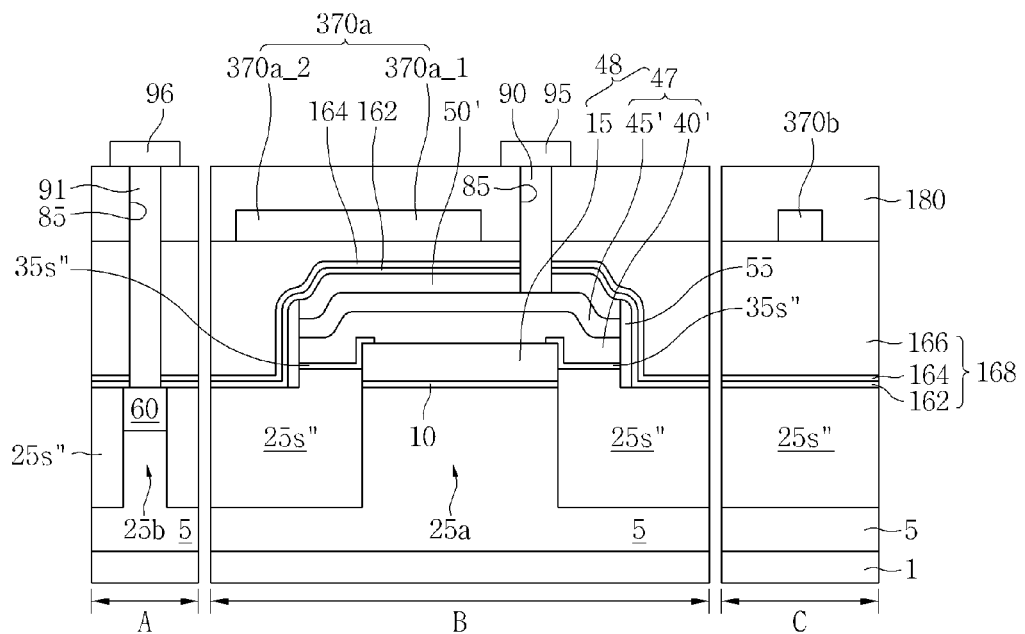
FIG. 4B is a cross-sectional view of another modified example of a semiconductor device according to an example embodiment of the inventive concepts.

FIG. 3 is a plan view of another modified example of a semiconductor device according to an example embodiment of the inventive concepts, and FIGS. 4A and 4B are cross-sectional views of modified examples of a semiconductor device according to example embodiments of the inventive concepts. In FIGS. 4A and 4B, portion "A" is a region taken along line I-I' of FIG. 3, portion "B" is a region taken along line II-II' of FIG. 3, and portion "C" is a region taken along line III-III' of FIG. 3.

Another modified example of a semiconductor device according to an example embodiment of the inventive concepts will now be described with reference to FIGS. 3 and 4A. Here, modified portions of the semiconductor device described with reference to FIG. 2A will be chiefly described.

Referring to FIGS. 3 and 4A, a substrate having a lower insulating layer 68 may be provided as described with reference to FIG. 2A. A protection pattern 270a may be provided on the lower insulating layer 68 in the first region CR. The protection pattern 270a may vertically overlap the top surface of the conductive pattern 48 and extend on the second top surface 25s2 of the insulating pattern 25s'''. For example, the protection pattern 270a may include a first portion 270a_1 vertically overlapping the top surface of the conductive pattern 48, a second portion 270a_2 extending from the first portion 270a_1 and vertically overlapping a side surface of the conductive pattern 48, and a third portion 270a_3 extending from the second portion 270a_2 onto the insulating pattern 25s" adjacent to the conductive pattern 48.

Meanwhile, a resistor 270b, which is substantially the same as the resistor 70b described with reference to FIG. 2A, may be provided on the lower insulating layer 68 in the second region RR.

The resistor 270b may be disposed at a lower level than the first portion 270a_1 of the protection pattern 270a. The resistor 270b may be disposed at substantially the same level and have substantially the same thickness as the third portion 270a_3 of the protection pattern 270a.

The upper insulating layer 80, the plugs 90, 91, and 92, and the interconnections 95, 96, and 97, which are described with reference to FIG. 2A, may be provided on the substrate having the protection pattern 270a and the resistor 270b.

Another modified example of a semiconductor device according to an example embodiment of the inventive concepts will be described with reference to FIGS. 3 and 4B. Here, modified portions of the semiconductor device described with reference to FIG. 2C will be chiefly described.

Referring to FIGS. 3 and 4B, a substrate having a lower insulating layer 168 may be provided as described with reference to FIG. 2C. A protection pattern 370a may be provided on the lower insulating layer 168 in the first region CR. The protection pattern 370a may cover the top surface of the conductive pattern 48 and extend onto the insulating pattern 25s". A resistor 370b may be provided on the lower insulating layer 168 in the second region RR. The protection pattern 370a may include a first portion 370a_1 vertically overlapping the top surface of the conductive pattern 48, and a second portion 370a_2 vertically overlapping the second top surface 25s2 of the insulating pattern 25s".

Figure 5:
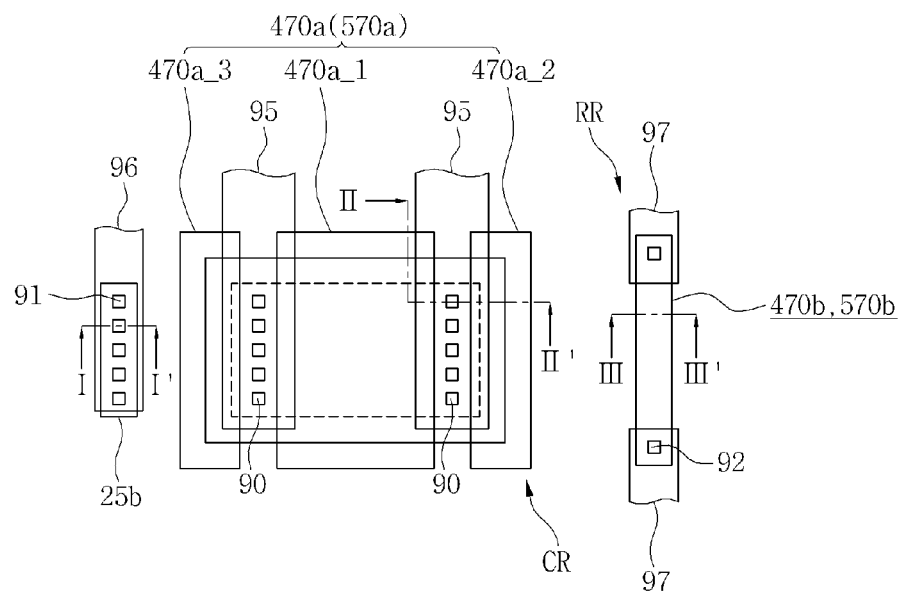
FIG. 5 is a plan view of another modified example of a semiconductor device according to an example embodiment of the inventive concepts.
Figure 6A:
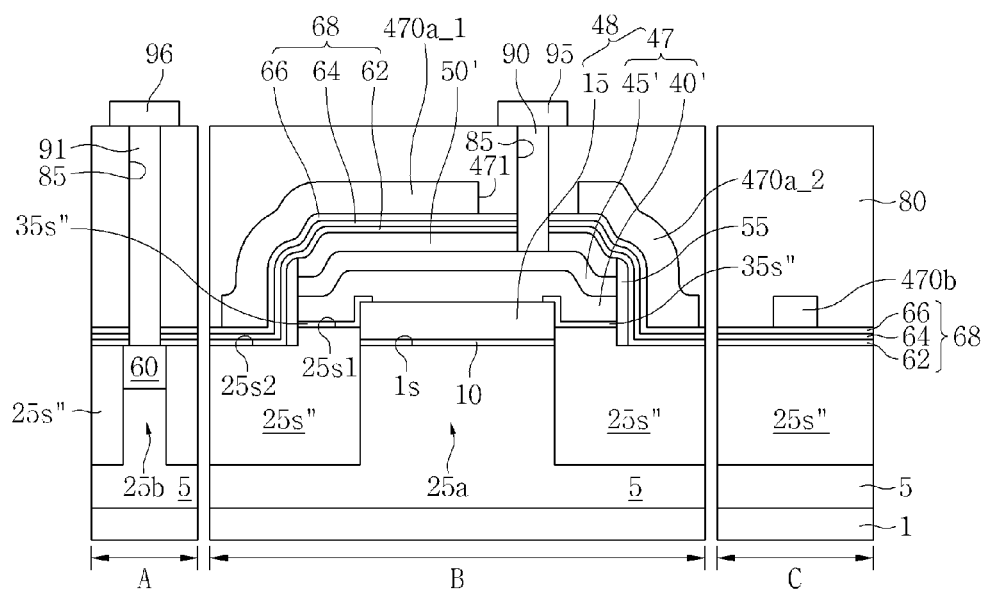
FIG. 6A is a cross-sectional view of another modified example of a semiconductor device according to an example embodiment of the inventive concepts.
Figure 6B:
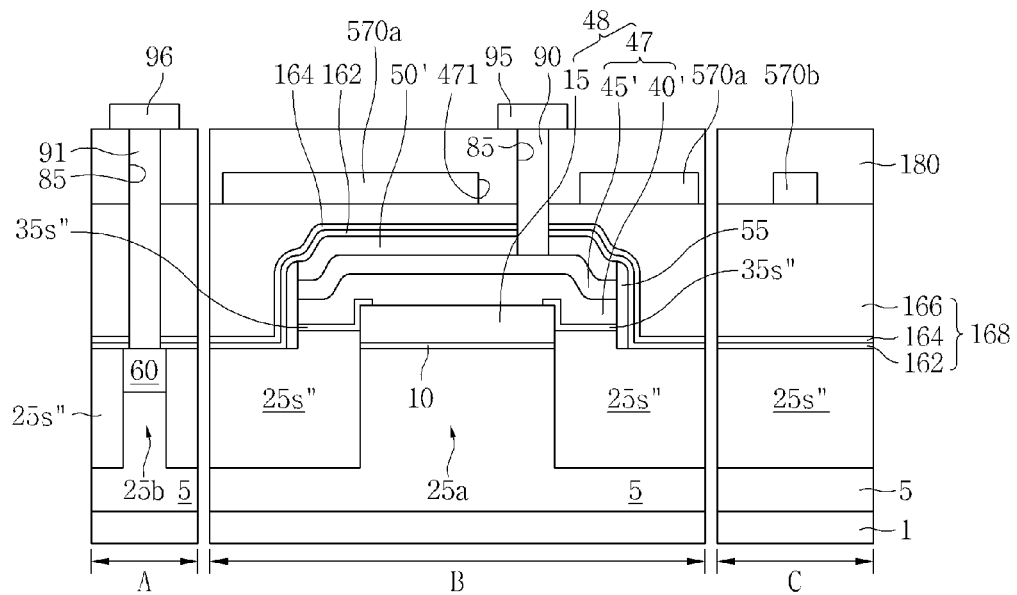
FIG. 6B is a cross-sectional view of another modified example of a semiconductor device according to an example embodiment of the inventive concepts.

FIG. 5 is a plan view of another modified example of a semiconductor device according to an example embodiment of the inventive concepts, and FIGS. 6A and 6B are cross-sectional views of modified examples of a semiconductor device according to an example embodiment of the inventive concepts. In FIGS. 6A and 6B, portion "A" is a region taken along line I-I' of FIG. 5, portion "B" is a region taken along line II-II' of FIG. 5, and portion "C" is a region taken along line III-III' of FIG. 5.

Another modified example of a semiconductor device according to an example embodiment of the inventive concepts will now be described with reference to FIGS. 5 and 6A. Here, modified portions of the semiconductor device described with reference to FIG. 2A will be chiefly described.

Referring to FIGS. 5 and 6A, a substrate having a lower insulating layer 68 may be provided as described with reference to FIG. 2A. A protection pattern 470a may be provided on the lower insulating layer 68 in the first region CR. A resistor 470b may be provided on the lower insulating layer 68 in the second region RR.

The protection pattern 470a may include a first pattern 470a_1, a second pattern 470a_2, and a third pattern 470a_3. The first pattern 470a_1 may run across a middle portion of the conductive pattern 48 and extend on the second top surface 25s2 of the insulating pattern 25s". The second pattern 470a_2 may cover any one corner of the conductive pattern 48 and overlap the second top surface 25s2 of the insulating pattern 25s". The third pattern 470a_3 may cover any one corner of the conductive pattern 48, which is not covered with the second pattern 470a_2, and overlap the second top surface 25s2 of the insulating pattern 25s".

The first pattern 470a_1 of the protection pattern 470a may be disposed at substantially the same level and have the same thickness as the resistor 470b.

Another modified example of the semiconductor device according to the present embodiment will be described with reference to FIGS. 5 and 6B. Here, modified portions of the semiconductor device described with reference to FIG. 2C will be chiefly described.

Referring to FIGS. 5 and 6B, a substrate having a lower insulating layer 168 may be provided as described with reference to FIG. 2C. A protection pattern 570a may be provided on the lower insulating layer 168 in the first region CR. A resistor 570b may be provided on the lower insulating layer 168 in the second region RR. The protection pattern 570a and the resistor 570b may be disposed at substantially the same level. The protection pattern 570a may have substantially the same planar shape as the protection pattern 470a of FIG. 6A. For example, in the plan view of FIG. 5, the protection pattern 570a may include a first pattern, a second pattern, and a third pattern. The first pattern may run across a middle portion of a conductive pattern 48 and extend on the second top surface 25s2 of the insulating pattern 25s". The second pattern may cover any one corner of the conductive pattern 48 and overlap the second top surface 25s2 of the insulating pattern 25s". The third pattern may cover any one corner of the conductive pattern 48, which is not covered with the second pattern 470a_2, and overlap the second top surface 25s2 of the insulating pattern 25s".

Figure 7:
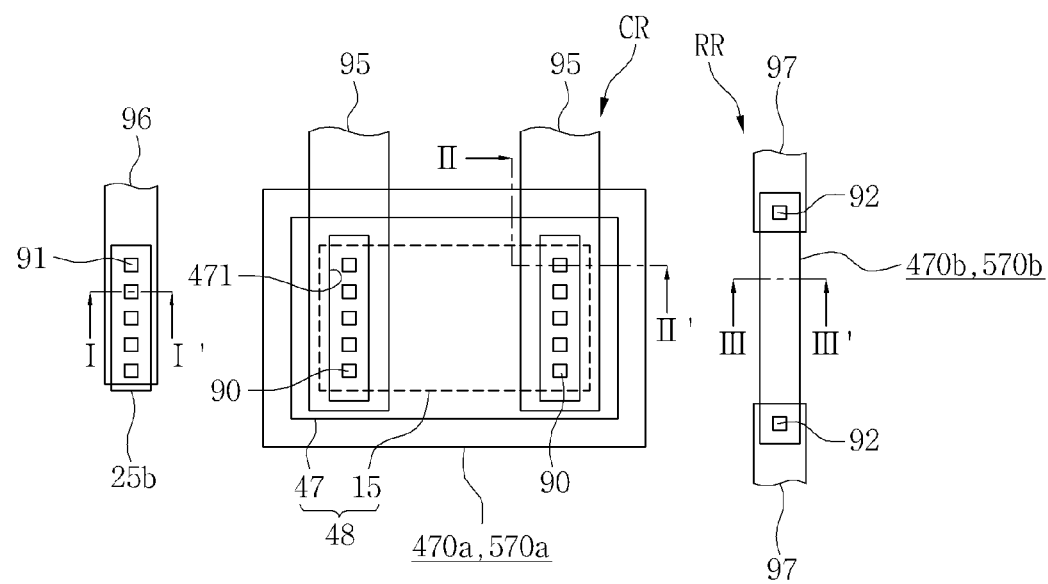
FIG. 7 is a plan view of another modified example of a semiconductor device according to an example embodiment of the inventive concepts.

Meanwhile, the planar shapes of the protection patterns 470a and 570a shown in FIGS. 6A and 6B may be modified as shown in FIG. 7. For instance, as shown in FIG. 7, the planar shape of each of the protection patterns 470a and 570a shown in FIGS. 6A and 6B may have a plate shape such that each of the protection pattern 470a and 570a has an opening 471 spaced apart from the plugs 90, 91, and 92 in portions penetrated by the plugs 90, 91, and 92. Also, each of the protection patterns 470a and 570a having the plate shapes may have a greater planar area and/or width than the conductive pattern 48.

Figure 8:
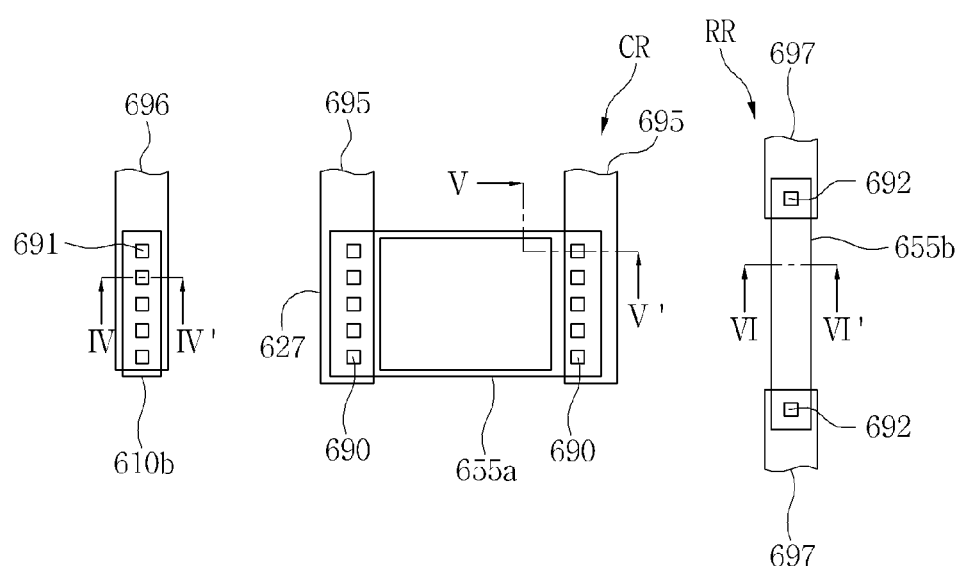
FIG. 8 is a plan view of another modified example of a semiconductor device according to an example embodiment of the inventive concepts.
Figure 9A:
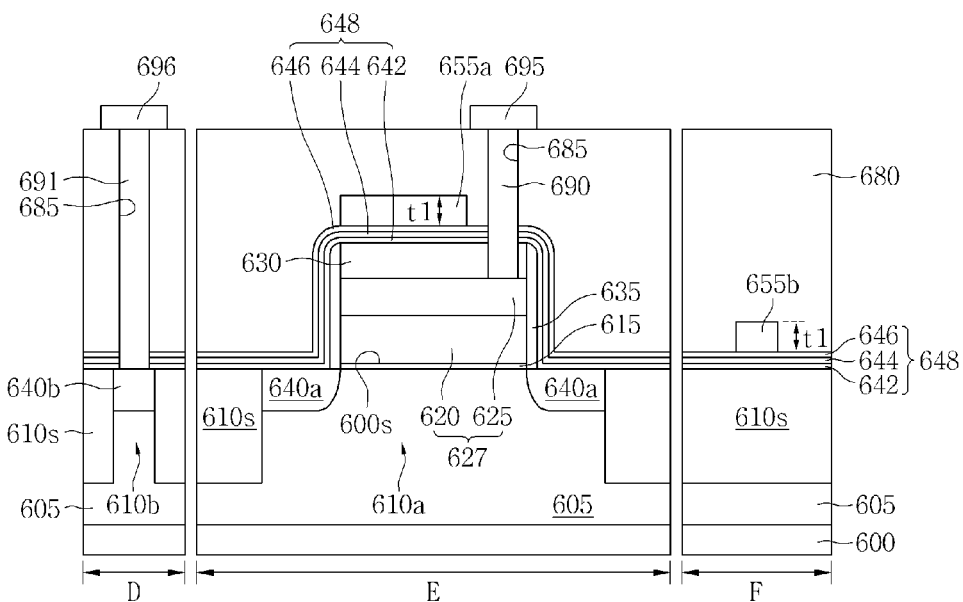
FIG. 9A is a cross-sectional view of another modified example of a semiconductor device according to an example embodiment of the inventive concepts.
Figure 9B:
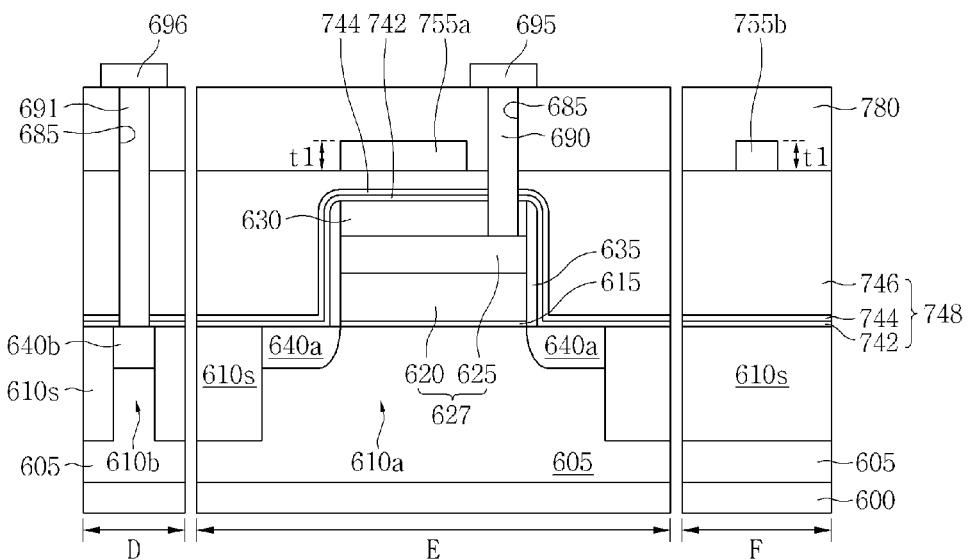
FIG. 9B is a cross-sectional view of another modified example of a semiconductor device according to an example embodiment of the inventive concepts.

FIG. 8 is a plan view of another modified example of a semiconductor device according to an example embodiment of the inventive concepts, and FIGS. 9A and 9B are cross-sectional views of modified examples of a semiconductor device according to an example embodiment of the inventive concepts. In FIGS. 9A and 9B, portion "A" is a region taken along line IV-IV' of FIG. 8, portion "B" is a region taken along line V-V' of FIG. 8, and portion "C" is a region taken along line VI-VI' of FIG. 8.

Another modified example of a semiconductor device according to an example embodiment of the inventive concepts will now be described with reference to FIGS. 8 and 9A.

Referring to FIGS. 8 and 9A, a substrate 600 having a first region CR and a second region RR may be provided. The substrate 600 may be a semiconductor substrate. As described with reference to FIG. 1, the first region CR may be a capacitor region, and the second region RR may be a resistor region. However, the first region CR according to the inventive concepts is not limited to the capacitor region. For instance, the first region CR may be a MOS transistor region where a MOS transistor may be formed.

A well region 605 may be provided in the substrate 600. The well region 605 may have an N conductivity type or P conductivity type.

An insulating pattern 610s may be provided in the substrate 600. The insulating pattern 610s may define a first active region 610a, and a second active region 610b in the first region CR.

A dielectric material 615, a conductive pattern 627, and a capping pattern 630 may be sequentially stacked on the first active region 610a. The conductive pattern 627 may include a first conductive pattern 620 and a second conductive pattern 625 stacked sequentially. The second conductive pattern 625 may be formed of a material having a lower resistivity than the first conductive pattern 620. For example, the first conductive pattern 620 may be formed of poly-Si, and the second conductive pattern 625 may be formed of a metal material, such as tungsten. The capping pattern 630 may be formed of an insulating material, such as silicon oxide and/or silicon nitride.

The dielectric material 615 and the conductive pattern 627 may constitute a capacitor. For instance, the dielectric material 615 may be a capacitor dielectric material of the capacitor, and the conductive pattern 627 may be a capacitor electrode thereof. Alternatively, the dielectric material 615 and the conductive pattern 627 may constitute a MOS transistor. For example, the dielectric material 615 may be a gate oxide layer of the MOS transistor, and the conductive pattern 627 may be a gate electrode thereof.

Spacers 635 may be provided on side surfaces of the conductive pattern 627 and the capping pattern 630. The spacers 635 may be formed of an insulating material, such as silicon oxide and/or silicon nitride.

A first impurity region 640a may be provided in the first active region 610a adjacent to the conductive pattern 627, and a second impurity region 640b may be provided in the second active region 610b. When the first region CR is the capacitor region and the conductive pattern 627 is used as an upper electrode of the capacitor, the first and second impurity regions 640a and 640b may have the same conductive type as the well region 605 and a higher dopant concentration than the well region 605. Alternatively, when the first region CR is the transistor region and the conductive pattern 627 is used as a gate electrode of the transistor, the first impurity region 640a may have a different conductivity type from the well region 605, and the second impurity region 640b may have the same conductivity type as the well region 605.

A lower insulating layer 648 may be provided on the substrate 600 having the first and second regions CR and RR to cover the insulating patterns 610s, the conductive pattern 627, and the capping pattern 630. The lower insulating layer 648 may include a first insulating layer 642, a second insulating layer 644, and a third insulating layer 646 stacked sequentially. The second insulating layer 644 may be formed of silicon nitride, and the first and third insulating layers 642 and 646 may be formed of silicon oxide.

A first semiconductor (e.g., first silicon) pattern 655a may be provided on the lower insulating layer 648 in the first region CR and overlap a top surface of the conductive pattern 627. A second semiconductor (e.g., second silicon) pattern 655b may be provided on the lower insulating layer 648 in the second region RR.

The first and second semiconductor (e.g., second silicon) patterns 655a and 655b may have substantially the same thickness t1 in a direction vertical to a surface 600s of the semiconductor substrate 600.

In some example embodiments, the first semiconductor (e.g., first silicon) pattern 655a may be a floating pattern, and the second semiconductor (e.g., second silicon) pattern 655b may be a resistor.

In some example embodiments, the first semiconductor (e.g., first silicon) pattern 655a may be defined as a protection pattern 655a configured to protect the dielectric material 615 from a subsequent plasma process, and the second semiconductor (e.g., second silicon) pattern 655b may be used as a resistor. The dielectric material 615 may be a capacitor dielectric material, and the conductive pattern 627 may be an upper electrode of the capacitor. Also, a portion of the first active region 610a, which overlaps the conductive pattern 627, may be defined as a lower electrode of the capacitor.

An upper insulating layer 680 may be provided on the substrate 600 having the first and second semiconductor (e.g., second silicon) patterns 655a and 655b. The upper insulating layer 680 may include oxide (e.g., an HDP oxide) formed using plasma. The first semiconductor (e.g., first silicon) pattern 655a may prevent or inhibit the dielectric material 615 from being damaged by UV light or charges generated during a plasma process.

A first contact plug 690 may be provided in a hole 685, which may penetrate the upper insulating layer 680, the lower insulating layer 648, and the capping pattern 630, and electrically connected to the conductive pattern 627. A second contact plug 691 may be provided in a hole 685, which may penetrate the upper and lower insulating layers 680 and 648, and electrically connected to the second impurity region 640b. Third contact plugs 692 may be provided in holes penetrating the upper insulating layer 680 and electrically connected to the second semiconductor (e.g., second silicon) pattern 655b. The third contact plugs 692 may be in contact with both end portions of the resistor 655b and electrically connected to the second semiconductor (e.g., second silicon) pattern 655b.

First through third interconnections 695, 696, and 697 may be provided on the upper insulating layer 680. The first interconnection 695 may cover the first contact plug 690 and be electrically connected to the first contact plug 690. The second interconnection 696 may cover the second contact plug 691 and be electrically connected to the second contact plug 691. The third interconnections 697 may cover the third contact plugs 692 and be electrically connected to the third contact plugs 692.

In some example embodiments, the first semiconductor (e.g., first silicon) pattern 655a may be surrounded by the lower and upper insulating layers 648 and 680 and floated. A bottom surface of the first semiconductor (e.g., first silicon) pattern 655a may be covered with the lower insulating layer 648, and top and side surfaces thereof may be covered with the upper insulating layer 680. Accordingly, the first semiconductor (e.g., first silicon) pattern 655a may be surrounded by the lower and upper insulating layers 648 and 680 and electrically floated.

The first semiconductor (e.g., first silicon) pattern 655a may protect the dielectric material 615 from plasma generated during a process for forming the first through third interconnections 695, 696, and 697.

Another modified example of the semiconductor device according to the present embodiment will be described with reference to FIGS. 8 and 9B.

Referring to FIGS. 8 and 9B, a substrate 600 having a dielectric material 615, a conductive pattern 627, and a capping pattern 630 stacked sequentially may be provided as described with reference to FIG. 9A. Also, an insulating pattern 610s and impurity regions 640a and 640b may be provided as described with reference to FIG. 9A.

A lower insulating layer 748 may be provided on the substrate 600 having the first and second regions CR and RR to cover the insulating pattern 610s, the conductive pattern 627, and the capping pattern 630. The lower insulating layer 748 may have a substantially planar top surface.

The lower insulating layer 748 may include a first insulating layer 742, a second insulating layer 744, and a third insulating layer 746. The first insulating layer 742 may be provided on the substrate 600 having the first and second regions CR and RR to conformably cover the insulating pattern 610s, the conductive pattern 627, and the capping pattern 630. The second insulating layer 744 may be conformably formed on the first insulating layer 742, and the third insulating layer 746 may be formed on the second insulating layer 746 and have a substantially planar top surface. The second insulating layer 744 may include silicon nitride, while the first and third insulating layers 742 and 746 may include silicon oxide. The third insulating layer 746 may include oxide formed using a non-plasma process. For example, the third insulating layer 746 may include an undoped silicate glass (USG) layer.

A first semiconductor (e.g., first silicon) pattern 755a may be provided on the lower insulating layer 748 in the first region CR, and a second semiconductor (e.g., second silicon) pattern 755b may be provided on the lower insulating layer 748 in the second region RR. The first and second semiconductor (e.g., second silicon) patterns 755a and 755b may have substantially the same vertical thickness. The first and second semiconductor (e.g., second silicon) patterns 755a and 755b may be formed at substantially the same level. The first semiconductor (e.g., first silicon) pattern 755a may be electrically floated. The first semiconductor (e.g., first silicon) pattern 755a may be a pattern configured to protect the dielectric material 615, and the second semiconductor (e.g., second silicon) pattern 755b may be a resistor.

An upper insulating layer 780 may be provided on the substrate 600 having the first and second semiconductor (e.g., second silicon) patterns 755a and 755b.

A first contact plug 690 may penetrate the upper and lower insulating layers 780 and 748 and the capping pattern 630 and be electrically connected to the upper conductive pattern 627. A second contact plug 691 may penetrate the upper and lower insulating layers 780 and 748 and be electrically connected to the second impurity region 640b. Third contact plugs 692 may penetrate the upper insulating layer 780 and be electrically connected to the second semiconductor (e.g., second silicon) pattern 755b.

First through third interconnections 695, 696, and 697 may be provided on the upper insulating layer 780. The first interconnection 695 may cover the first contact plug 690 and be electrically connected to the first contact plug 690, and the second interconnection 696 may cover the second contact plug 691 and be electrically connected to the second contact plug 691. The third interconnections 697 may cover the third contact plugs 692 and be electrically connected to the third contact plugs 692.

Figure 10:
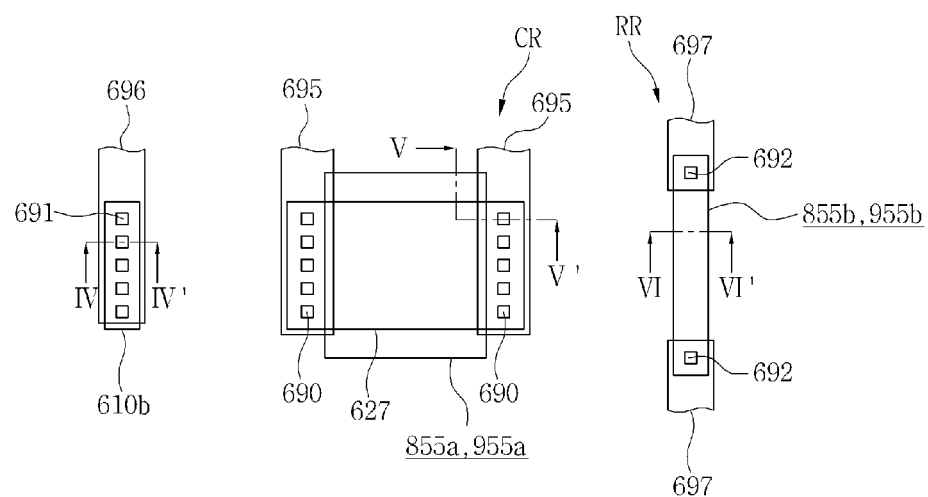
FIG. 10 is a plan view of another modified example of a semiconductor device according to an example embodiment of the inventive concepts.
Figure 11A:
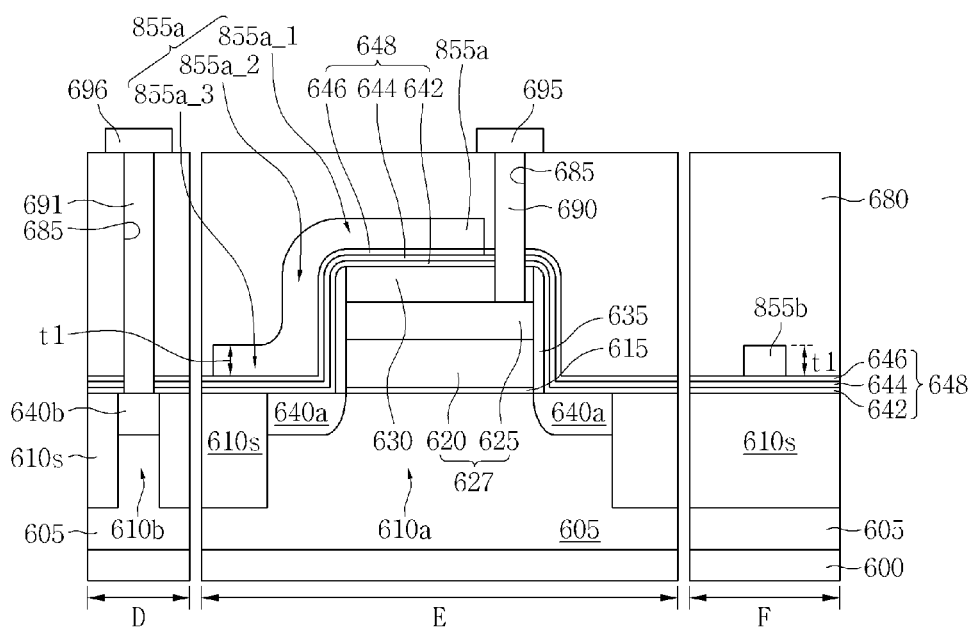
FIG. 11A is a cross-sectional view of another modified example of a semiconductor device according to an example embodiment of the inventive concepts.
Figure 11B:
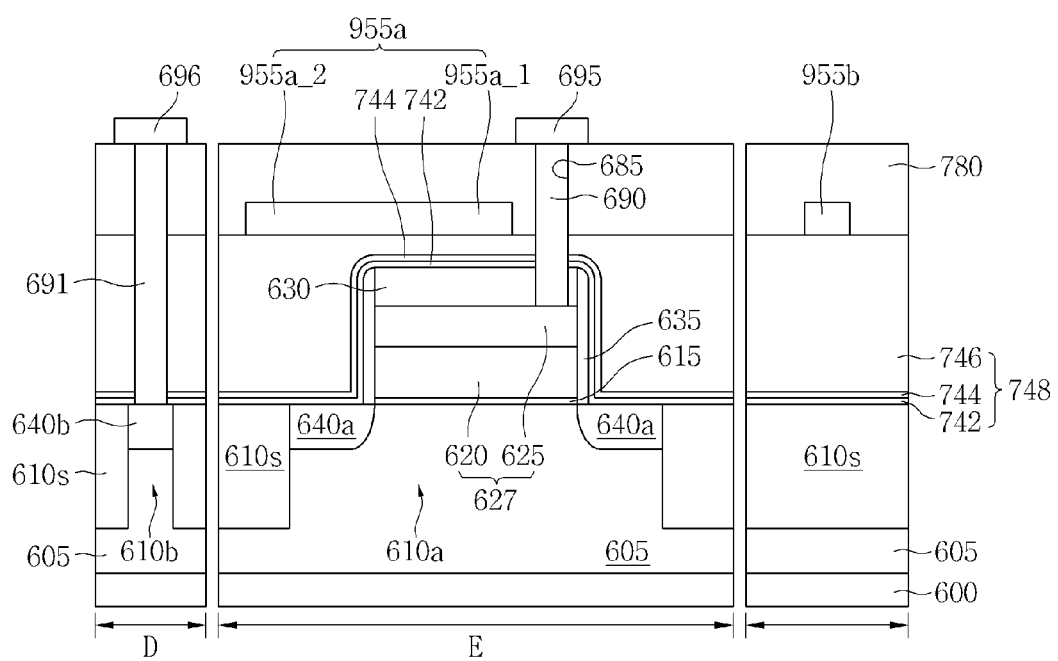
FIG. 11B is a cross-sectional view of another modified example of a semiconductor device according to an example embodiment of the inventive concepts.

FIG. 10 is a plan view of another modified example of a semiconductor device according to an example embodiment of the inventive concepts, and FIGS. 11A and 11B are cross-sectional views of modified examples of a semiconductor device according to an example embodiment of the inventive concepts. In FIGS. 11A and 11B, portion "A" is a region taken along line IV-IV' of FIG. 10, portion "B" is a region taken along line V-V' of FIG. 10, and portion "C" is a region taken along line VI-VI' of FIG. 10.

Another modified example of the semiconductor device according to the present embodiment will now be described with reference to FIGS. 10 and 11A.

Referring to FIGS. 10 and 11A, a substrate 600 having the lower insulating layer 648 may be provided as described with reference to FIG. 9A. A first semiconductor (e.g., first silicon) pattern 855a may be provided on the lower insulating layer 648 in the first region CR. A second semiconductor (e.g., second silicon) pattern 855b may be provided on the lower insulating layer 648 in the second region RR. The first semiconductor (e.g., first silicon) pattern 855a may be electrically floated. The first semiconductor (e.g., first silicon) pattern 855a may be a protection pattern, while the second semiconductor (e.g., second silicon) pattern 855b may be a resistor.

The first semiconductor (e.g., first silicon) pattern 855a may include a first portion 855a_1 and a second portion 855a_2. The first portion 855a_1 may vertically overlap a top surface of the conductive pattern 627, and the second portion 855a_2 may extend from the first portion 855a_1 and horizontally overlap a side surface of the conductive pattern 627. Furthermore, the first semiconductor (e.g., first silicon) pattern 855a may include a third portion 855a_3, which may extend from the second portion 855a_2 onto a top surface of the first active region 610a and/or a top surface of the insulating pattern 610s. The third portion 855a_3 of the first semiconductor (e.g., first silicon) pattern 855a may be disposed at substantially the same level as the second semiconductor (e.g., second silicon) pattern 855b. The first portion 855a_1 of the first semiconductor (e.g., first silicon) pattern 855a may be disposed at a higher level than the second semiconductor (e.g., second silicon) pattern 855b.

An upper insulating layer 680 may be provided on the substrate 600 having the first and second semiconductor (e.g., second silicon) patterns 855a and 855b. As described with reference to FIG. 9A, plugs 690, 691, and 692 and interconnections 695, 696, and 697 may be electrically connected to the conductive pattern 627, the second impurity region 640b, and the second semiconductor (e.g., second silicon) pattern 855b.

Another modified example of the semiconductor device according to the present embodiment will be described with reference to FIGS. 10 and 11B.

Referring to FIGS. 10 and 11B, a substrate 600 having the lower insulating layer 748 may be provided as described with reference to FIG. 9B. A first semiconductor (e.g., first silicon) pattern 955a may be provided on the lower insulating layer 748 in the first region CR, and include a first portion 955a_1 and a second portion 955a_2. The first portion 955a_1 may vertically overlap a top surface of the conductive pattern 627, and the second portion 955a_2 may extend from the first portion 955a_1 and may not vertically overlap the top surface of the conductive pattern 627. A second semiconductor (e.g., second silicon) pattern 955b may be provided on the lower insulating layer 748 in the second region RR. The first semiconductor (e.g., first silicon) pattern 955a may be a protection pattern configured to protect the dielectric material 615, and the second semiconductor (e.g., second silicon) pattern 955b may be a resistor.

An upper insulating layer 780 may be provided on the substrate 600 having the first and second semiconductor (e.g., second silicon) patterns 955a and 955b. As described with reference to FIG. 9B, plugs 690, 691, and 692 and interconnections 695, 696, and 697 may be electrically connected to the conductive pattern 627, the second impurity region 640b, and the second semiconductor (e.g., second silicon) pattern 955b.

Figure 12A:
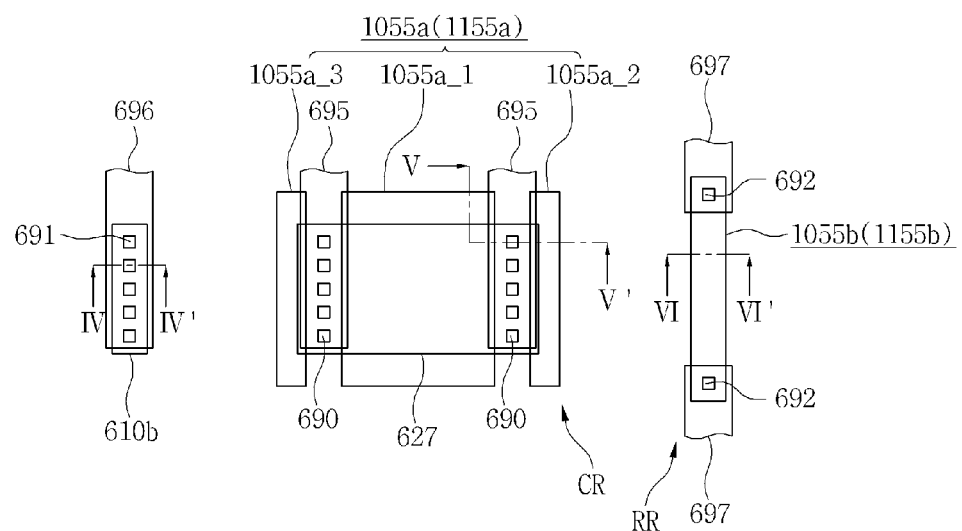
FIG. 12A is a plan view of another modified example of a semiconductor device according to an example embodiment of the inventive concepts.
Figure 12B:
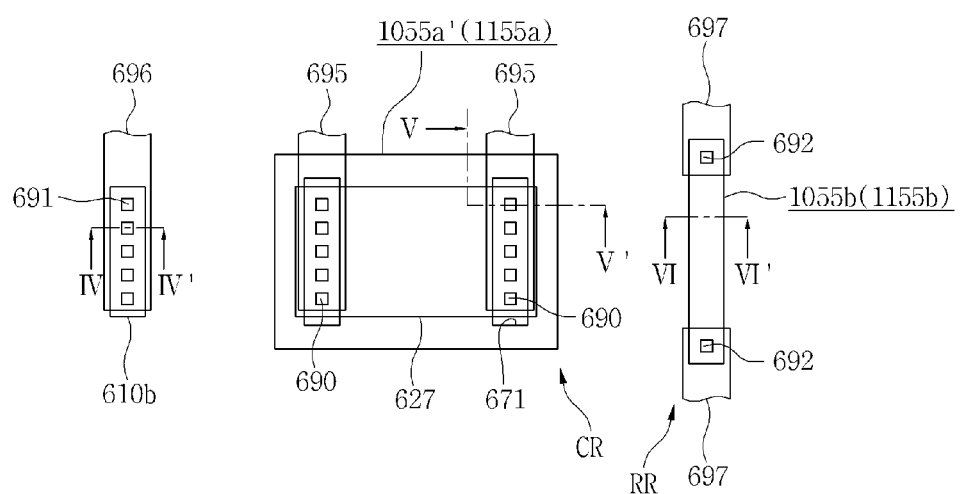
FIG. 12B is a plan view of another modified example of a semiconductor device according to an example embodiment of the inventive concepts.
Figure 13A:
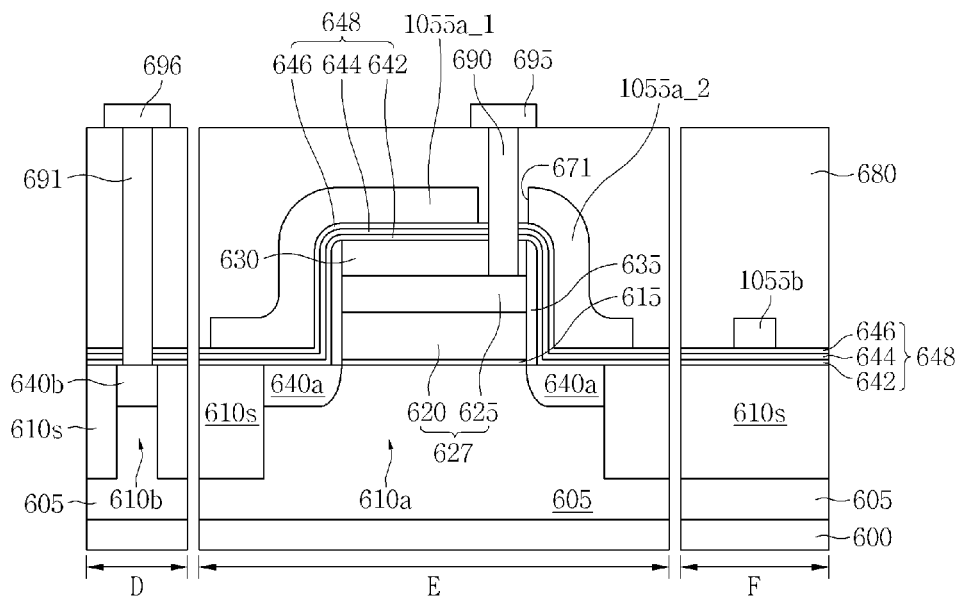
FIG. 13A is a cross-sectional view of another modified example of a semiconductor device according to an example embodiment of the inventive concepts.
Figure 13B:
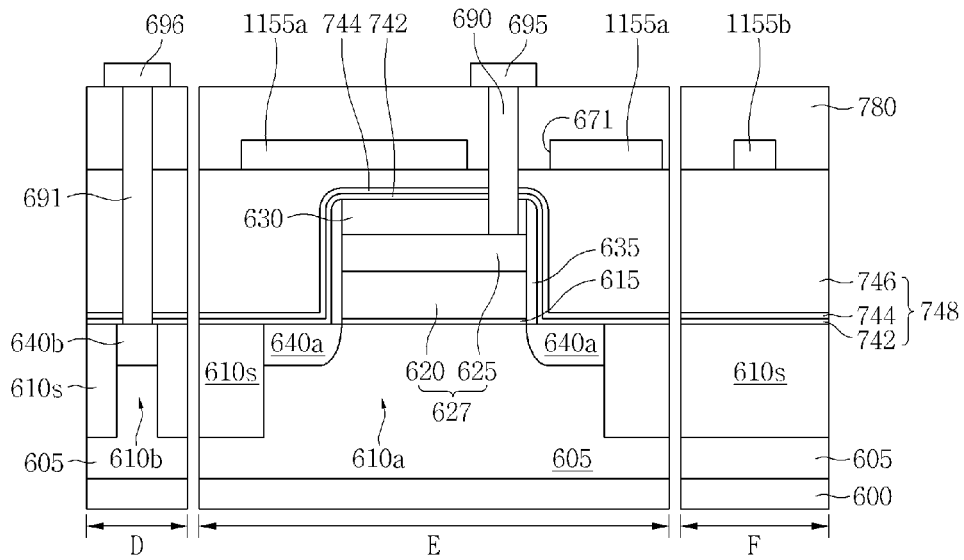
FIG. 13B is a cross-sectional view of another modified example of a semiconductor device according to an example embodiment of the inventive concepts.

Each of FIGS. 12A and 12B is a plan view of another modified example of a semiconductor device according to an example embodiment of the inventive concepts, and FIGS. 13A and 13B are cross-sectional views of modified examples of a semiconductor device according to an example embodiment of the inventive concepts. In FIGS. 13A and 13B, portion "A" is a region taken along line IV-IV' of FIGS. 12A and 12B, portion "B" is a region taken along line V-V' of FIGS. 12A and 12B, and portion "C" is a region taken along line VI-VI' of FIGS. 12A and 12B.

Another modified example of a semiconductor device according to an example embodiment of the inventive concepts will now be described with reference to FIGS. 12A and 13A.

Referring to FIGS. 12A and 13A, a substrate 600 having the lower insulating layer 648 may be provided as described with reference to FIG. 9A. A first semiconductor (e.g., first silicon) pattern 1055a may be provided on the lower insulating layer 648 in the first region CR. A second semiconductor (e.g., second silicon) pattern 1055b may be provided on the lower insulating layer 648 in the second region RR. The first semiconductor (e.g., first silicon) pattern 1055a may be electrically floated. The first semiconductor (e.g., first silicon) pattern 1055a may be a protection pattern, while the second semiconductor (e.g., second silicon) pattern 1055b may be a resistor.

The first semiconductor (e.g., first silicon) pattern 1055a may include a first pattern 1055a_1, a second pattern 1055a_2, and a third pattern 1055a_3. From a plan view, the first pattern 1055a_1 may run across a middle portion of the conductive pattern 627, and the second and third patterns 1055a_2 and 1055a_3 may be formed to cover corners of the conductive pattern 627. From the plan view, since shapes of the first through patterns 1055a_1, 1055a_2, and 1055a_3, and an arrangement relationship among the first through third patterns 1055a_1, 1055a_2, and 1055a_3 are the same as the first through third patterns 470a_1, 470a_2, and 470a_3 described with reference to FIG. 5, a detailed description thereof will be omitted.

An upper insulating layer 680 may be formed on the substrate 600 having the first through third patterns 1055a 1, 1055a_2, and 1055a_3 and the resistor 1055b.

Thereafter, as described with reference to FIG. 9A, plugs 690, 691, and 692 and interconnections 695, 696, and 697 may be electrically connected to the conductive pattern 627, the second impurity region 640b, and the second semiconductor (e.g., second silicon) pattern 1055b.

Another modified example of the semiconductor device according to the present embodiment will be described with reference to FIGS. 12A and 13B.

Referring to FIGS. 12A and 13B, a substrate 600 having the lower insulating layer 748 may be provided as described with reference to FIG. 9B. A first semiconductor (e.g., first silicon) pattern 1155a may be provided on the lower insulating layer 748 in the first region CR. A second semiconductor (e.g., second silicon) pattern 1155b may be provided on the lower insulating layer 748 in the second region RR. The first and second semiconductor (e.g., second silicon) patterns 1155a and 1155b may be disposed at substantially the same level and have the same thickness. From a plan view, the first semiconductor (e.g., first silicon) pattern 1155a may include first through third patterns having substantially the same planar shapes and planar arrangement relationships as the first through third patterns 1055a_1, 1055a_2, and 1055a_3 described with reference to FIG. 13A. Since planar shapes of the first through third patterns of the first semiconductor (e.g., first silicon) pattern 1155a and a planar arrangement relationship among the first through third patterns are substantially the same as the first semiconductor (e.g., first silicon) pattern 1055a described with reference to FIG. 13A, a detailed description thereof will be omitted. An upper insulating layer 780 may be provided on the substrate having the first and second semiconductor (e.g., second silicon) patterns 1155a and 1155b. As described with reference to FIG. 9B, plugs 690, 691, and 692 and interconnections 695, 696, and 697 may be electrically connected to the conductive pattern 627, the second impurity region 640b, and the second semiconductor (e.g., second silicon) pattern 1155b.

Meanwhile, the planar shapes of the protection patterns 1055a and 1155a shown in FIGS. 12A, 13A, and 13B may be modified as shown in FIG. 12B. For example, as shown in FIG. 12B, the planar shape of each of the protection patterns 1055a and 1155a shown in FIGS. 13A and 13B may have a plate shape 1055a' such that each of the protection patterns 1055a and 1155a has a closed opening 671 spaced apart from the plugs 690, 691, and 692 in portions penetrated by the plugs 690, 691, and 692. Also, each of the protection patterns 1055a and 1155a having the plate shape 1055a' may have a greater planar area and/or width than the conductive pattern 627.

A method of fabricating a semiconductor device according to an example embodiment of the inventive concepts will be described with reference to FIGS. 14A through 26.

To begin with, the method of fabricating the semiconductor device according to the present embodiment will now be described with reference to FIGS. 14A through 14H. In FIGS. 14A through 14H, portion "A" is a region taken along line I-I' of FIG. 1, portion "B" is a region taken along line of FIG. 1, and portion "C" is a region taken along line of FIG. 1.

Figure 14A:
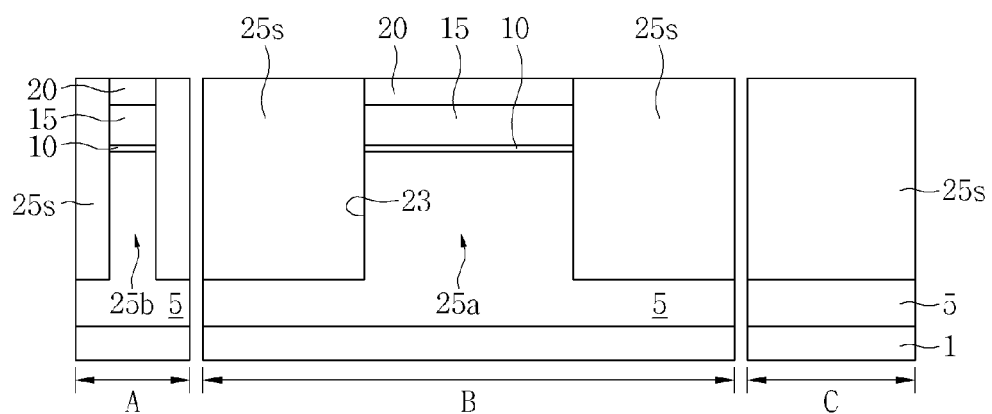
FIGS. 14A through 14H are cross-sectional views illustrating a method of fabricating a semiconductor device according to an example embodiment of the inventive concepts.

Referring to FIGS. 1 and 14A, a substrate 1 having a first region CR and a second region RR may be prepared. The substrate 1 may be a semiconductor substrate. The substrate 1 may be a silicon substrate. The first region CR may be a first circuit region, while the second region RR may be a second circuit region. For example, the first region CR may be a region where a capacitor may be formed, while the second region RR may be a region where a resistor may be formed. The first region CR may be capacitor region, while the second region RR may be a resistor region.

A well region 5 may be formed in the substrate 1. The well region 5 may have an N conductivity type or P conductivity type.

A dielectric material and a lower conductive layer may be sequentially formed on the substrate 1. Thereafter, a sacrificial mask 20 may be formed on the lower conductive layer, and the lower conductive layer, the dielectric material, and the substrate 1, which are disposed under the sacrificial mask 20, may be sequentially etched. The lower conductive layer and the dielectric material, which may remain under the sacrificial mask 20, may be defined as a lower conductive pattern 15 and a capacitor dielectric material 10, respectively. An etched portion of the substrate 1 may be defined as a trench 23.

The capacitor dielectric material 10 may include silicon oxide and/or a high-k dielectric material. The high-k dielectric material may be a dielectric material having a higher dielectric constant than silicon oxide. The lower conductive pattern 15 may be formed of poly-Si. The sacrificial mask 20 may be formed of a material, such as silicon oxide or silicon nitride.

An insulating layer may be formed on the substrate 1 having the trench 23 and planarized to form an insulating pattern 25s. The insulating pattern 25s may be formed of silicon oxide.

A plurality of active regions 25a and 25b may be defined by the insulating pattern 25s filling the trench 23. The active regions 25a and 25b may include a first active region 25a and a second active region 25b. The insulating pattern 25s may be interposed between the first and second active regions 25a and 25b. The well region 5 may be formed in the first and second regions 25a and 25b, and also formed in the substrate 1 under the first active region 25a and in the substrate 1 under the second active region 25b.

Figure 14B:
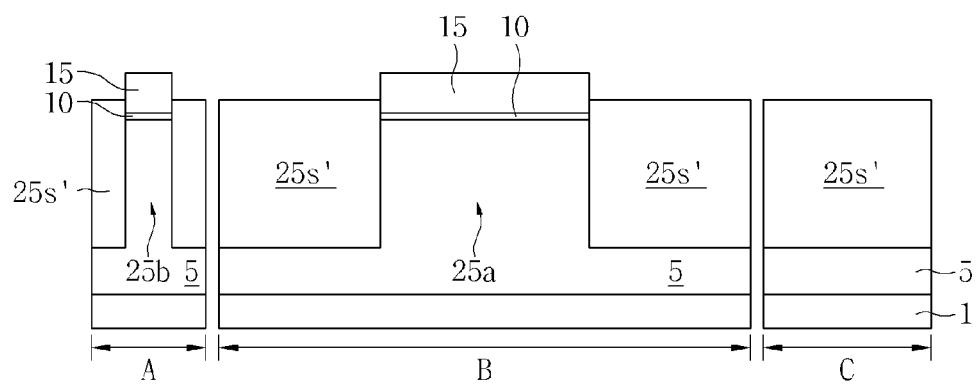

Referring to FIGS. 1 and 14B, the sacrificial mask (refer to 20 in FIG. 14A) disposed on the lower conductive pattern 15 may be removed to expose a top surface of the lower conductive pattern 15. Meanwhile, the insulating pattern 25s may be partially etched to expose a side surface of the lower conductive pattern 15 to form an insulating pattern 25s' having a lowered top surface.

Figure 14C:
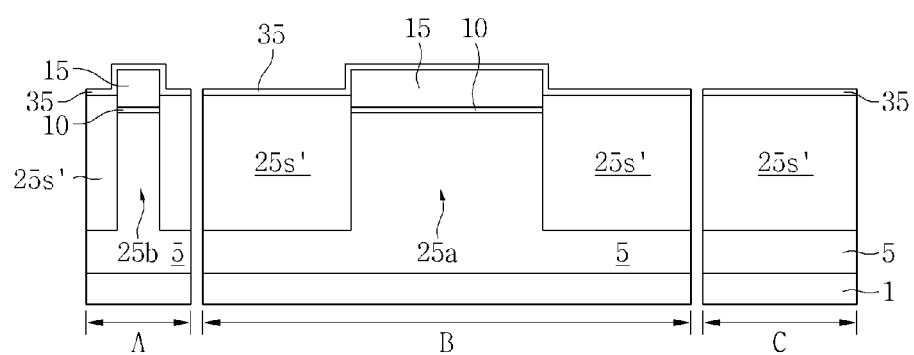

Referring to FIGS. 1 and 14C, an inter-gate dielectric material 35 may be formed on the substrate 1 having the lower conductive pattern 15 having the exposed top surface. The inter-gate dielectric material 35 may include oxide, nitride, and oxide stacked sequentially.

Figure 14D:
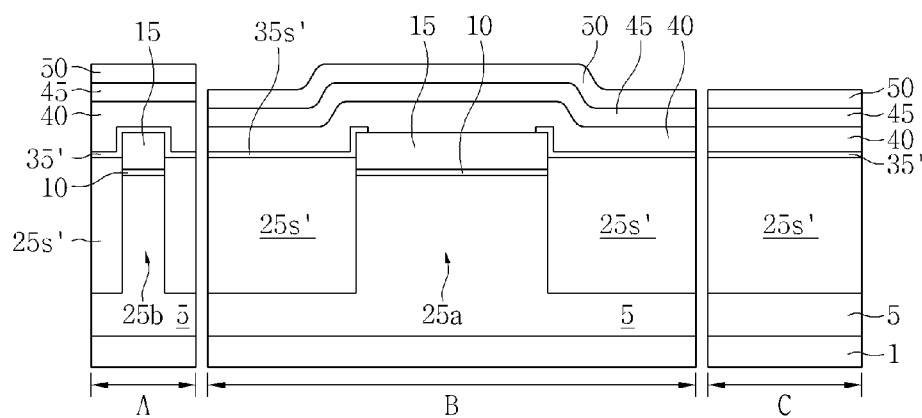

Referring to FIGS. 1 and 14D, the inter-gate dielectric material 35 may be patterned to expose the top surface of the lower conductive pattern 15. The inter-gate dielectric material 35 may remain on a partial region of the top surface of the lower conductive pattern 15, the side surface of the lower conductive pattern 15, and the insulating pattern 25s'.

A first conductive layer 40, a second conductive layer 45, and a capping layer 50 may be formed on the substrate 1 having the remained inter-gate dielectric material 35'.

Figure 14E:
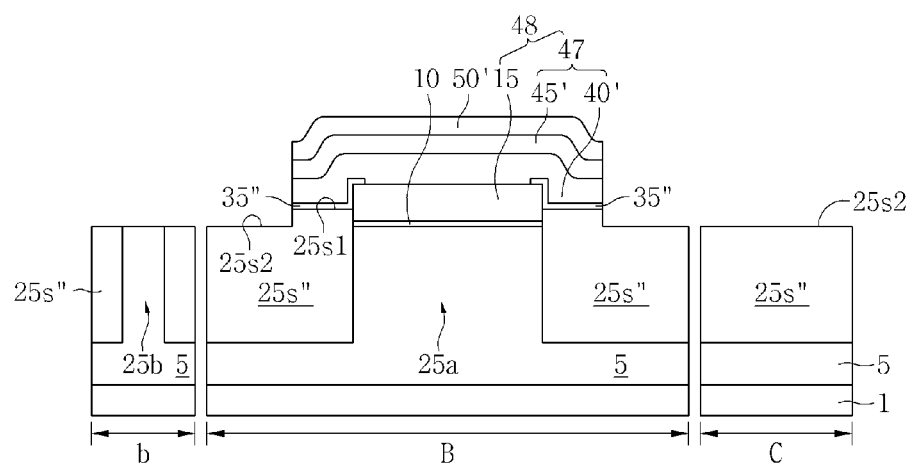

Referring to FIGS. 1 and 14E, the capping layer 50 may be patterned to form a capping pattern 50'. The second conductive layer 45 and the first conductive layer 40, which are disposed under the capping pattern 50', may be sequentially patterned to form the second pattern 45' and the first pattern 40'. The first pattern 40' and the second pattern 45' may be sequentially stacked to constitute an upper conductive pattern 47.

Meanwhile, by use of the capping pattern 50' as an etch mask, the remained inter-gate dielectric material 35' may be etched, and the lower conductive pattern 15, which is not covered with the capping pattern 50', may be etched. Accordingly, the lower conductive pattern 15 disposed on the second active region 25b may be removed by etching, and the remained inter-gate dielectric material 35' may be remained under the upper conductive pattern 47 to form an inter-gate dielectric pattern 35".

Meanwhile, while the lower conductive pattern 15 disposed on the second active region 25b is being removed by etching, the insulating pattern 25' may be partially etched. Accordingly, an insulating pattern 25s" having a top surface with a step difference may be formed. The insulating pattern 25s" may have a first top surface 25s1 disposed under the upper conductive pattern 47, and a second top surface 25s2 disposed adjacent to the upper conductive pattern 47 at a lower level than the first top surface 25s1.

Meanwhile, during the formation of the insulating pattern 25s" having the top surface with the step difference, the capacitor dielectric material 10 disposed on the second active region 25b may be etched.

Figure 14F:
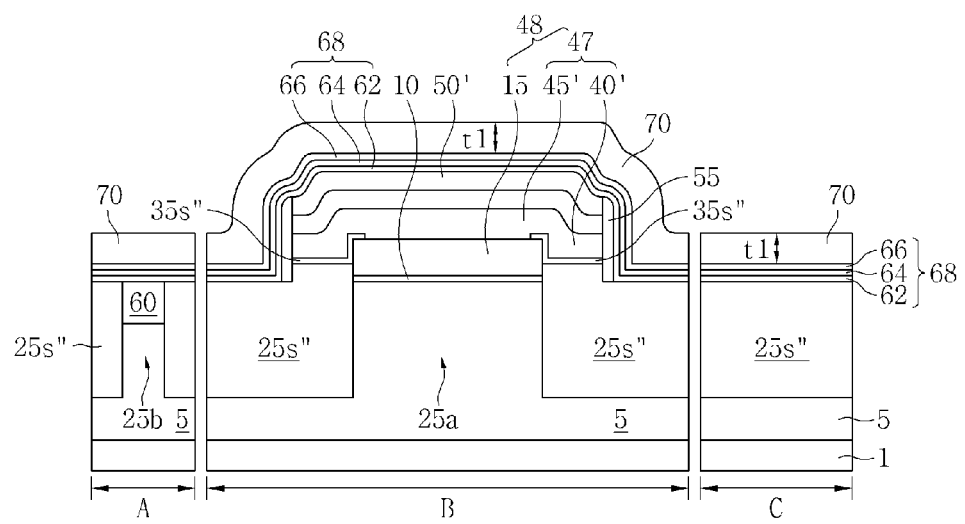

Referring to FIGS. 1 and 14F, a spacer layer may be formed on the substrate 1 having the capping pattern 50', the upper conductive pattern 47, the inter-gate dielectric pattern 35" and the insulating pattern 25s", and anisotropically etched. Accordingly, spacers 55 may be formed on side surfaces of the capping pattern 50' and the upper conductive pattern 47 and extend onto the second top surface 25s2 of the insulating pattern 25s". The spacers 55 may be formed of an insulating material, such as silicon oxide or silicon nitride.

An ion implantation process may be performed on the substrate 1 having the spacers 55, thereby forming an impurity region 60 in the second active region 25b. The impurity region 60 may have the same conductivity type as the well region 5 and a higher dopant concentration than the well region 5. The impurity region 60 and the well region 5 may have an N conductivity type. In another case, the impurity region 60 and the well region 5 may have a P conductivity type.

A lower insulating layer 68 may be formed on the substrate 1 having the spacers 55. The lower insulating layer 68 may include a plurality of layers. For instance, the lower insulating layer 68 may include a first insulating layer 62, a second insulating layer 64, and a third insulating layer 66 stacked sequentially. The second insulating layer 64 may be formed of a material having an etch selectivity with respect to the first and third insulating layers 62 and 66. For example, the first insulating layer 62 may include silicon oxide conformably formed on the substrate 1 having the spacers 55, and the second insulating layer 64 may include silicon nitride conformably formed on the first insulating layer 62. The third insulating layer 66 may include silicon oxide conformably formed on the second insulating layer 64.

A silicon layer 70 may be formed on the lower insulating layer 68. The silicon layer 70 may be a crystalline silicon layer. The silicon layer 70 may be a poly-Si layer. The silicon layer 70 may be conformally formed on the lower insulating layer 68.

Figure 14G:
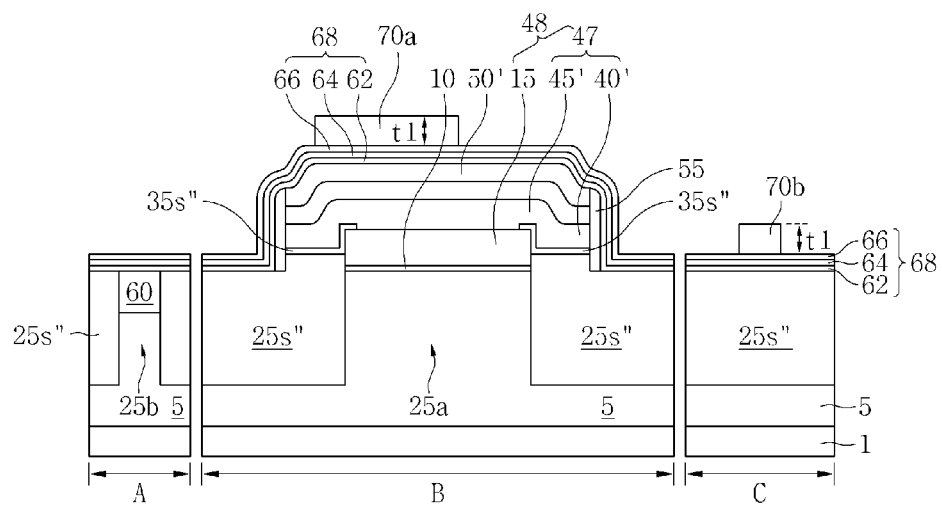

Referring to FIGS. 1 and 14G, the silicon layer 70 may be patterned so that a first semiconductor (e.g., first silicon) pattern 70a may be formed in the first region CR, and a second semiconductor (e.g., second silicon) pattern 70b may be formed in the second region RR. The first semiconductor (e.g., first silicon) pattern 70a may be defined as a protection pattern, while the second pattern 70b may be used as a resistor. Accordingly, the protection pattern 70a and the resistor 70b may be formed of the same material to substantially the same thickness.

The protection pattern 70a may overlap the upper conductive pattern 47. The protection pattern 70a may be formed on the capping pattern 50' disposed on the upper conductive pattern 47. From a plan view, the protection pattern 70a may overlap the upper conductive pattern 47. From a cross-sectional view, the protection pattern 70a may vertically overlap the upper conductive pattern 47. From a plan view, the protection pattern 70a may be formed to have a smaller planar area than the upper conductive pattern 47.

The resistor 70b may be formed to a smaller width than the protection pattern 70a. For example, the protection pattern 70a may be formed to a first width W1, while the resistor 70b may be formed to a second width W2 smaller than the first width W1.

Figure 14H:
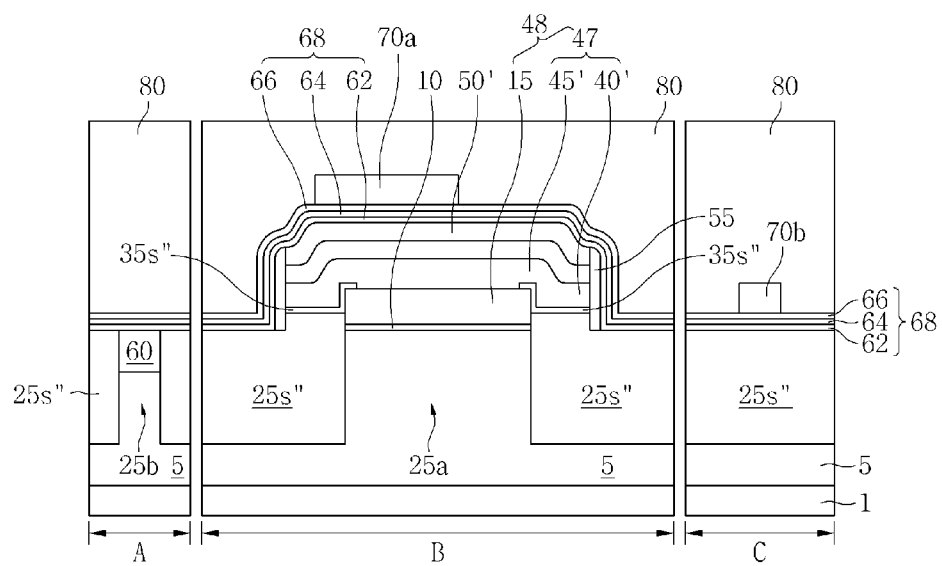

Referring to FIGS. 1 and 14H, an upper insulating layer 80 may be formed on the substrate 1 having the protection pattern 70a and the resistor 70b. The upper insulating layer 80 may be a single layer or a stacked layer. The upper insulating layer 80 may include oxide formed using plasma. For example, a semiconductor process of forming oxide using plasma may be performed on the substrate 1 having the protection pattern 70a and the resistor 70b so that an HDP oxide can be formed on the substrate 1 having the protection pattern 70a and the resistor 70b.

The protection pattern 70a may protect the dielectric material 10 from UV light generated from plasma used for forming the HDP oxide. The protection pattern 70a may mostly prevent or inhibit charges generated by plasma from being accumulated in the conductive pattern 48. Accordingly, the amount of charges accumulated in the conductive pattern 48 may not reach a level at which the dielectric material 10 may be damaged.

Thereafter, as shown in FIGS. 1 and 2A, contact plugs may be formed. The contact plugs may include first through third contact plugs 90, 91, and 92. The first contact plug 90 may be formed through the upper and lower insulating layers 80 and 68 and the capping pattern 50' and electrically connected to the upper conductive pattern 47. The first contact plug 90 may be in contact with the upper conductive pattern 47. The second contact plug 91 may be formed through the upper and lower insulating layers 80 and 68 and electrically connected to the impurity region 60. The second contact plug 91 may be in contact with the impurity region 60. The third contact plugs 92 may be formed through the upper insulating layer 80 and electrically connected to the resistor 70b. The third contact plugs 92 may be in contact with both end portions of the resistor 70b and electrically connected to the resistor 70b.

Interconnections may be formed on the upper insulating layer 80. The interconnections may include first through third interconnections 95, 96, and 97.

The first interconnection 95 may cover the first contact plug 90 and be electrically connected to the first contact plug 90. The second interconnection 96 may cover the second contact plug 91 and be electrically connected to the second contact plug 91. The third interconnections 97 may cover the third contact plugs 92 and be electrically connected to the third contact plugs 92.

Figure 15:
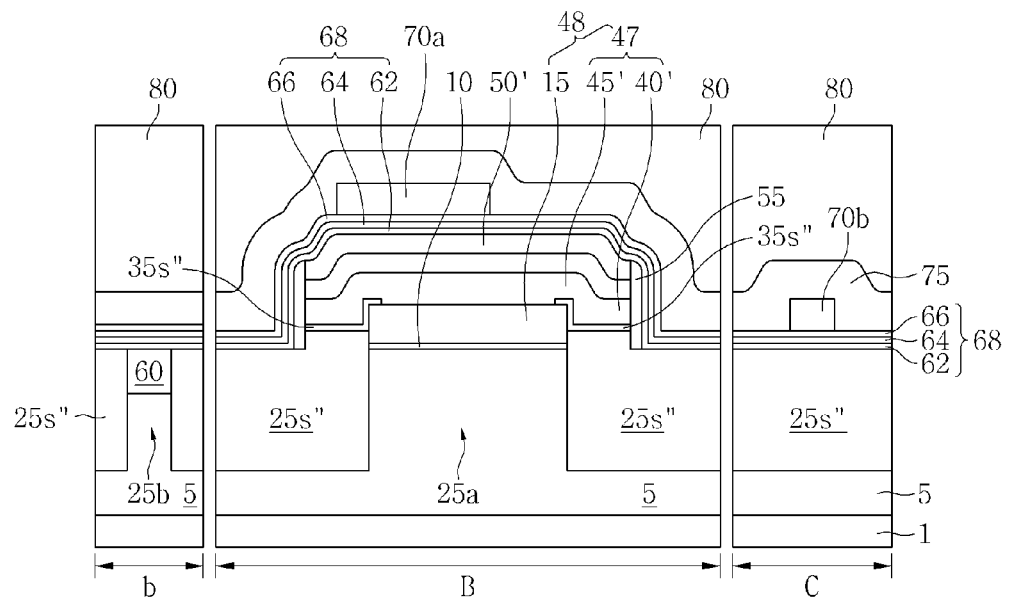
FIG. 15 is a cross-sectional view of a modified example of a method of fabricating a semiconductor device according to an example embodiment of the inventive concepts.

Meanwhile, as shown in FIG. 15, before the upper insulating layer 80 is formed, a buffer insulating layer 75 may be formed. The buffer insulating layer 75 may include silicon oxide formed using a non-plasma deposition process. For example, the buffer insulating layer 75 may be formed using oxide, such as USG.

Figure 16A:
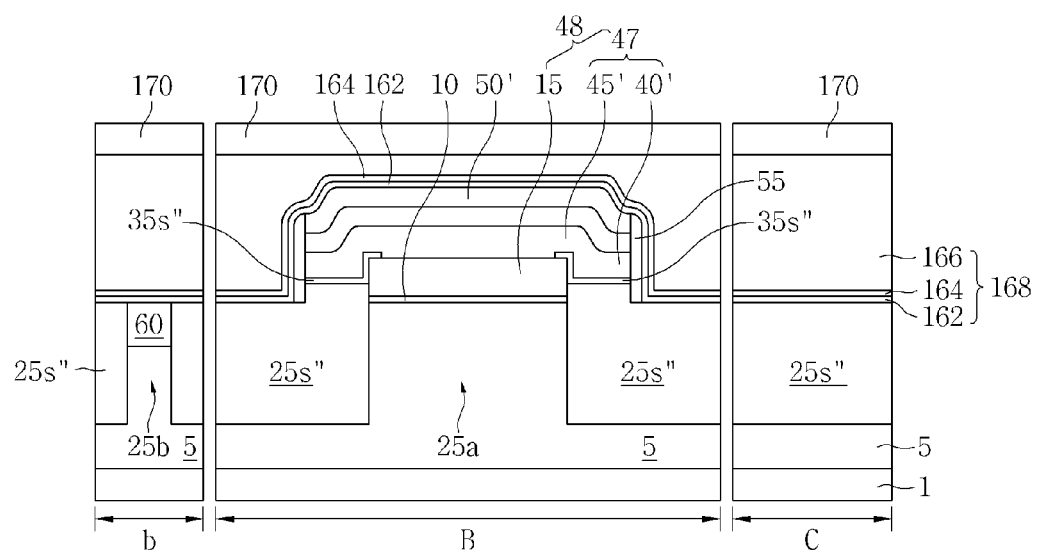
FIGS. 16A and 16B are cross-sectional views of another modified example of a method of fabricating a semiconductor device according to an example embodiment of the inventive concepts.
Figure 16B:
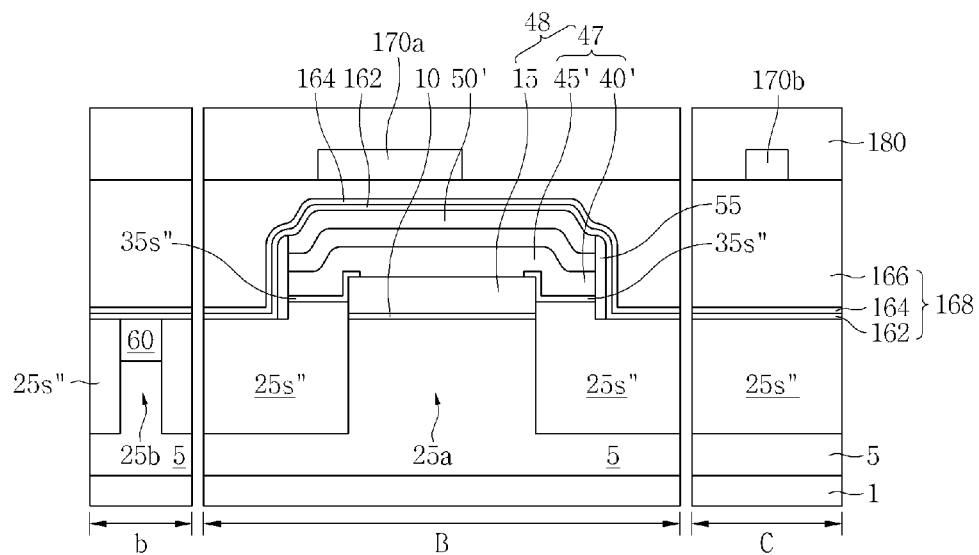

A method of fabricating a semiconductor device according to a modified example of an example embodiment of the inventive concepts will be described with reference to FIGS. 16A and 16B. FIGS. 16A and 16B are cross-sectional views illustrating a method of fabricating the semiconductor device described with reference to FIG. 2C.

Referring to FIG. 16A, a substrate 1 may be provided as described with reference to FIGS. 14A through 14E. For example, as described with reference to FIG. 14E, the semiconductor substrate 1 on which the conductive pattern 48 and the capping pattern 50' are sequentially stacked may be prepared. Spacers 55 may be formed on side surfaces of the conductive pattern 48 and the capping pattern 50'.

A lower insulating layer 168 may be formed on the substrate 1 having the spacers 55. The lower insulating layer 168 may include a plurality of layers. For example, the lower insulating layer 168 may include a first insulating layer 162, a second insulating layer 164, and a third insulating layer 166. The first insulating layer 162 may be conformably formed on the substrate 1 having the spacers 55, and the second insulating layer 164 may be conformably formed on the first insulating layer 162. The third insulating layer 166 may be formed on the substrate 1 having the second insulating layer 164 to have a planar top surface. The first insulating layer 162 may be formed of silicon oxide, and the second insulating layer 164 may be formed of silicon nitride. Also, the third insulating layer 166 may be formed of silicon oxide.

A silicon layer 170 may be formed on the lower insulating layer 168. The silicon layer 170 may be formed to a uniform thickness. The silicon layer 170 may be formed of crystalline silicon, for example, poly-Si.

Referring to FIG. 16B, the silicon layer 170 may be patterned using photolithography and etching processes, thereby forming a protection pattern 170a and a resistor 170b. The protection pattern 170a and the resistor 170b may be disposed at substantially the same level. An upper insulating layer 180 may be formed on the substrate 1 having the protection pattern 170a and the resistor 170b.

Subsequently, as described with reference to FIGS. 1 and 2A, plugs 90, 91, and 92 may be formed through the upper and lower insulating layers 180 and 168, and interconnections 95, 96, and 97 may be formed on the plugs 90, 91, and 92.

Figure 17:
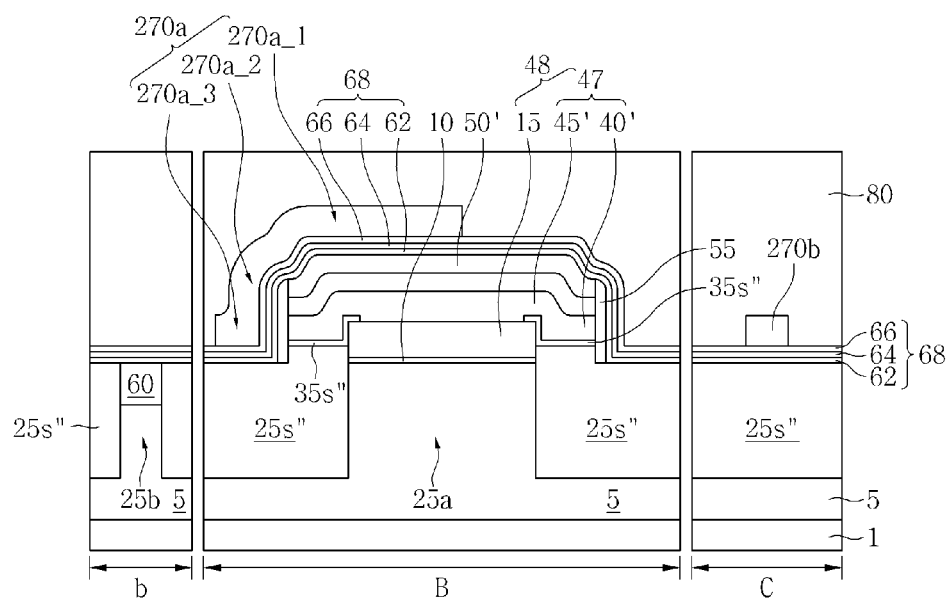
FIG. 17 is a cross-sectional view of another modified example of a method of fabricating a semiconductor device according to an example embodiment of the inventive concepts.

A method of fabricating a semiconductor device according to another modified example of the present embodiment will be described with reference to FIG. 17. FIG. 17 is a cross-sectional view illustrating a method of the semiconductor device described with reference to FIG. 4A.

Referring to FIG. 17, a substrate 1 on which the silicon layer 70 is formed may be prepared as described with reference to FIG. 14F. The silicon layer 70 may be patterned, thereby forming a protection pattern 270a and a resistor 270b.

The protection pattern 270a may vertically overlap a top surface of the conductive pattern 48 and extend onto the insulating pattern 25s'''. For example, the protection pattern 270a may include a first portion 270a_1, a second portion 270a_2, and a third portion 270a_3. The first portion 270a_1 may vertically overlap the top surface of the conductive pattern 48. The second portion 270a_2 may extend from the first portion 270a_1 and vertically overlap a side surface of the conductive pattern 48. The third portion 270a_3 may extend from the second portion 270a_2 onto the insulating pattern 25s''' adjacent to the conductive pattern 48. The resistor 270b may be formed on the lower insulating layer 68 in the resistive region RR. An upper insulating layer 80 may be formed on the substrate 1 having the protection pattern 270a and the resistor 270b.

Thereafter, as shown in FIG. 4A, plugs 90, 91, and 92 may be formed through the upper and lower insulating layers 80 and 68, and interconnections 95, 96, and 97 may be formed on the plugs 90, 91, and 92.

Figure 18:
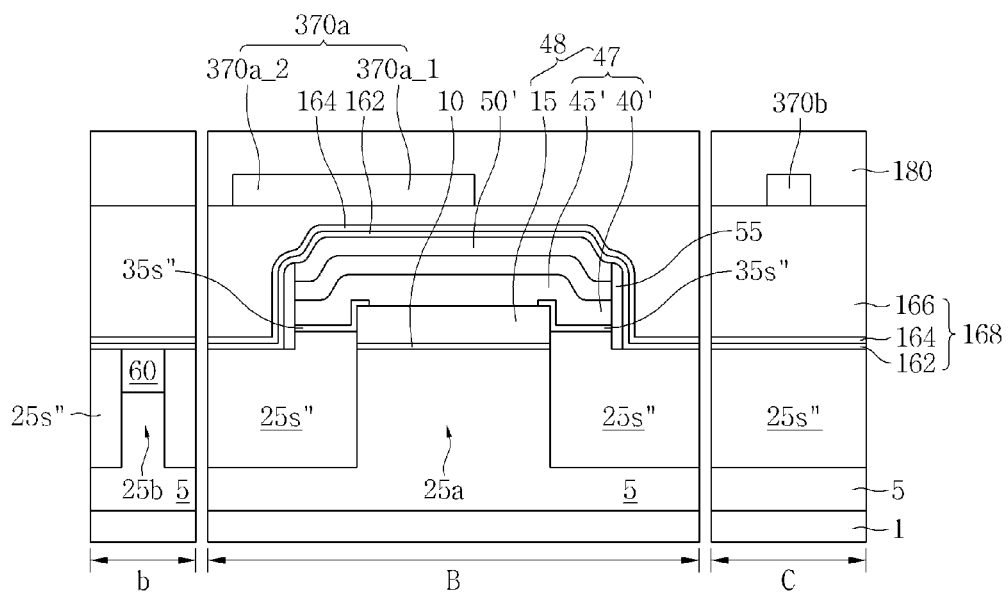
FIG. 18 is a cross-sectional view of another modified example of a method of fabricating a semiconductor device according to an example embodiment of the inventive concepts.

A method of fabricating a semiconductor device according to another modified example of the present embodiment will be described with reference to FIG. 18. FIG. 18 is a cross-sectional view illustrating a method of fabricating the semiconductor device described with reference to FIG. 4B.

Referring to FIG. 18, a substrate 1 having the silicon layer 170 may be prepared as described with reference to FIG. 16A. The silicon layer 170 may be patterned so that a protection pattern 370a may be formed to cover a top surface of the conductive pattern 48 and extend onto the insulating pattern 25s''' and a resistor 370b may be formed on the resistive region RR. The protection pattern 370a may include a first portion 370a_1 and a second portion 370a_2. The first portion 370a_1 may vertically overlap a top surface of the conductive pattern 48, and the second portion 370a_2 may vertically overlap the second top surface 25s2 of the insulating pattern 25s'''.

An upper insulating layer 180 may be formed on the substrate 1 having the protection pattern 370a and the resistor 370b.

Thereafter, as shown in FIG. 4B, plugs 90, 91, and 92 may be formed through the upper and lower insulating layers 180 and 168, and interconnections 95, 96, and 97 may be formed on the plugs 90, 91, and 92.

Figure 19:
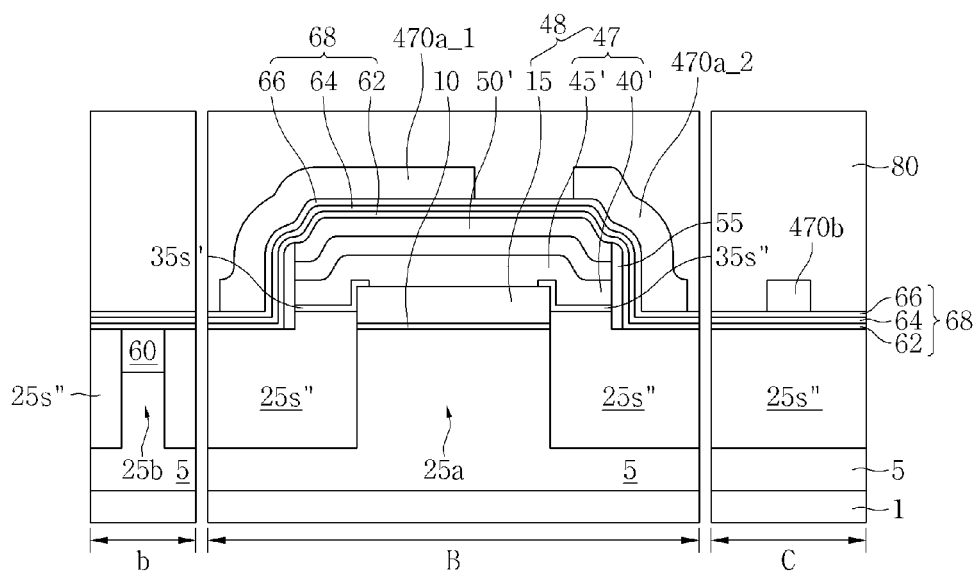
FIG. 19 is a cross-sectional view of another modified example of a method of fabricating a semiconductor device according to an example embodiment of the inventive concepts.

A method of fabricating a semiconductor device according to another modified example of the present embodiment will be described with reference to FIG. 19. FIG. 19 is a cross-sectional view illustrating a method of fabricating the semiconductor device described with reference to FIG. 6A.

Referring to FIG. 19, a substrate 1 on which the silicon layer 70 is formed may be prepared as described with reference to FIG. 14F. The silicon layer 70 may be patterned so that a protection pattern 470a may be formed on the capacitor region CR and a resistor 470b may be formed on the resistor region RR.

The protection pattern 470a may include a first pattern 470a_1, a second pattern 470a_2, and a third pattern 470a_3. The first pattern 470a_1 may run across a middle portion of the conductive pattern 48 and extend onto the second top surface 25s2 of the insulating pattern 25s'''. The second pattern 470a_2 may cover any one corner of the conductive pattern 48 and overlap the second top surface 25s2 of the insulating pattern 25s'''. The third pattern 470a_3 may cover any one corner of the conductive pattern 48, which is not covered with the second pattern 470a_2, and overlap the second top surface 25s2 of the insulating pattern 25s''.

The second pattern 470a_1 may run across the middle portion of the conductive pattern 48, while the second and third patterns 470a_2 and 470a_3 may be disposed opposite each other across the first pattern 470a_1 and cover the corner of the conductive pattern 48.

An upper insulating layer 80 may be formed on the substrate 1 including the protection pattern 470a having the first through third patterns 470a_1, 470a_2, and 470a_3 and the resistor 470b.

Thereafter, as shown in FIG. 6A, plugs 90, 91, and 92 may be formed through the upper and lower insulating layers 80 and 68, and interconnections 95, 96, and 97 may be formed on the plugs 90, 91, and 92.

Figure 20:
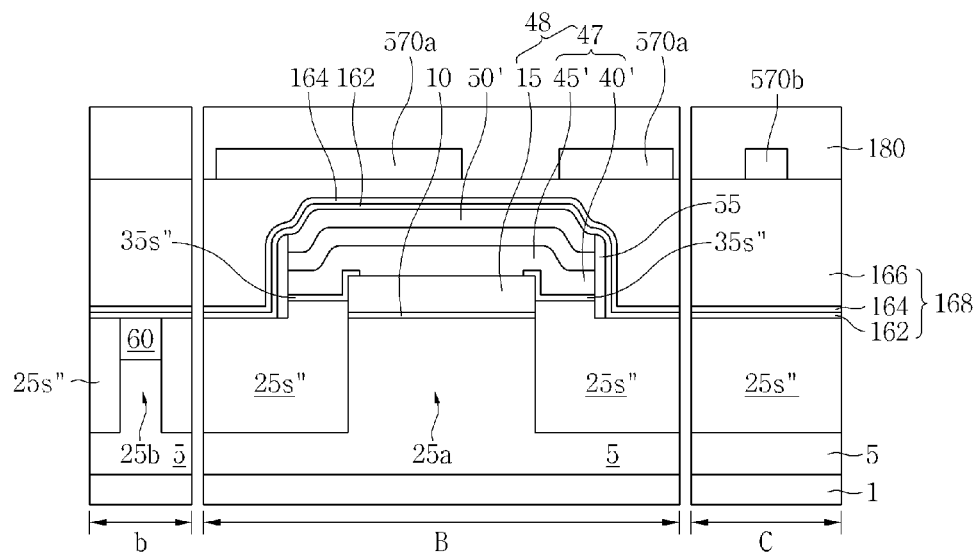
FIG. 20 is a cross-sectional view of another modified example of a method of fabricating a semiconductor device according to an example embodiment of the inventive concepts.

A method of fabricating a semiconductor device according to another modified example of the present embodiment will be described with reference to FIG. 20. FIG. 20 is a cross-sectional view illustrating a method of fabricating the semiconductor device described with reference to FIG. 6B.

Referring to FIG. 20, a substrate 1 having the silicon layer 170 may be prepared as described with reference to FIG. 16A. The silicon layer 170 may be patterned so that a protection pattern 570a may be formed on the capacitor region CR, and a resistor 570b may be formed on the resistor region RR.

The protection pattern 570a may have substantially the same planar shape as the protection pattern 470a described with reference to FIG. 19. The protection pattern 570a may be formed at substantially the same level as the resistor 570b. An upper insulating layer 180 may be formed on the substrate 1 having the protection pattern 570a and the resistor 570b.

Thereafter, as shown in FIG. 6B, plugs 90, 91, and 92 may be formed through the upper and lower insulating layers 180 and 168, and interconnections 95, 96, and 97 may be formed on the plugs 90, 91, and 92.

Figure 21A:
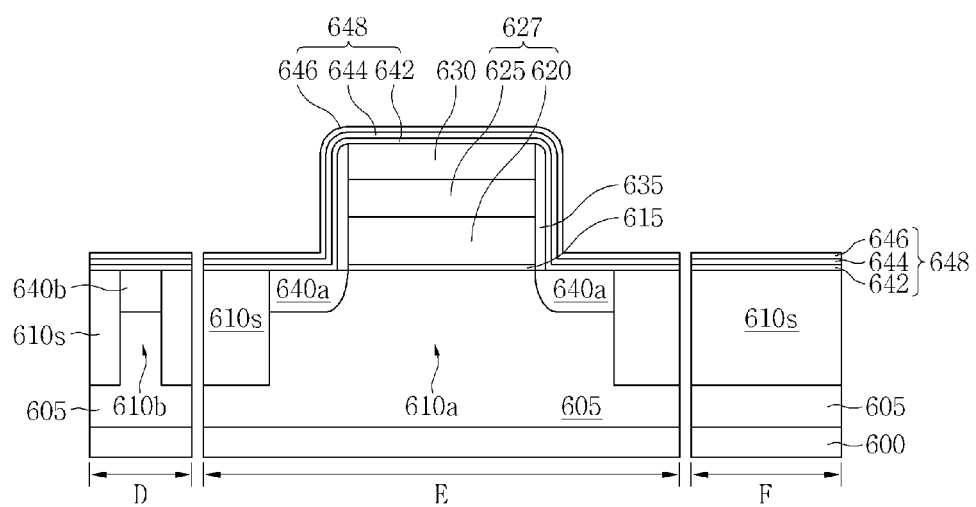
FIGS. 21A through 21C are cross-sectional views of another modified example of a method of fabricating a semiconductor device according to an example embodiment of the inventive concepts.
Figure 21B:
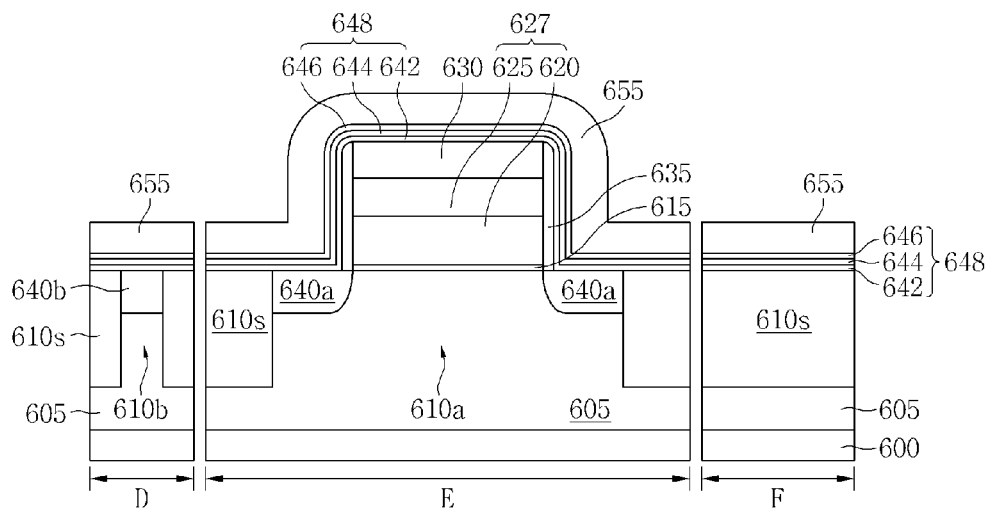
Figure 21C:
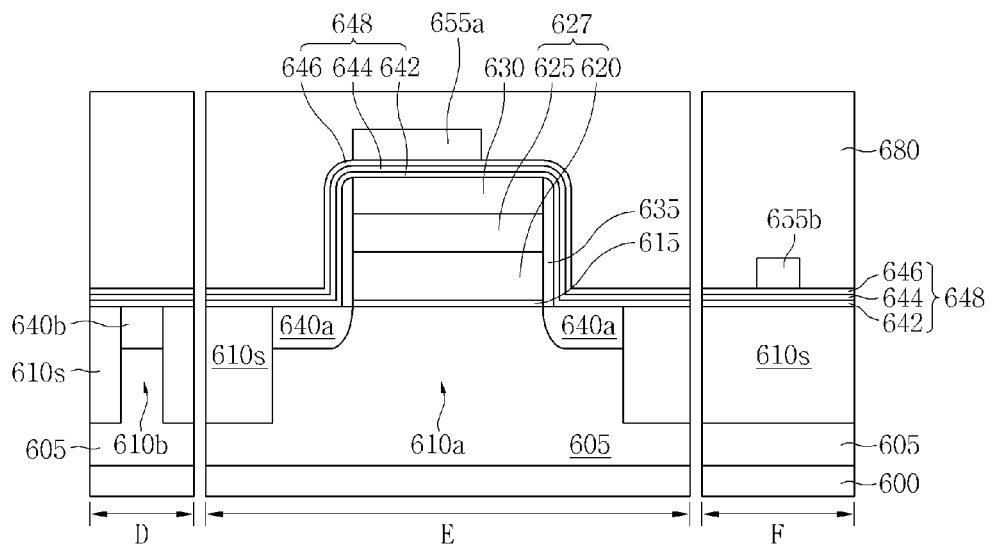

A method of fabricating a semiconductor device according to another modified example of the present embodiment will be described with reference to FIGS. 21A through 21C. FIGS. 21A through 21C are cross-sectional views illustrating a method of fabricating the semiconductor device described with reference to FIG. 9A.

Referring to FIG. 21A, a substrate 600 having a first region CR and a second region RR may be prepared. The substrate 600 may be a semiconductor substrate. The first region CR may be a capacitor region and/or a MOS transistor region, while the second region RR may be a resistor region. A well region 605 may be formed in the substrate 600. The well region 605 may have an N conductivity type or P conductivity type.

An insulating pattern 610s may be formed in the substrate 600. The insulating pattern 610s may define a first active region 610a and a second active region 610b in the first region CR. The formation of the insulating pattern 610s may include forming a trench in the substrate 600, and forming an insulating material layer to fill the trench. The insulating material layer filling the trench may be defined as the insulating pattern 610s.

A dielectric material may be formed on the substrate 600 having the insulating pattern 610s, and a conductive layer and a capping pattern 630 may be sequentially stacked on the dielectric material. The conductive layer disposed under the capping pattern 630 may be patterned to form a conductive pattern 627. Accordingly, a dielectric material 615, a conductive pattern 627, and a capping pattern 630 may be sequentially stacked on the first active region 610a. The conductive pattern 627 may include a first conductive pattern 620 and a second conductive pattern 625 stacked sequentially. The second conductive pattern 625 may be formed of a material having a lower resistivity than the first conductive pattern 620. For example, the first conductive pattern 620 may be formed of poly-Si, and the second conductive pattern 625 may be formed of a metal material, such as tungsten.

Spacers 635 may be formed on side surfaces of the conductive pattern 627 and the capping pattern 630. The spacers 635 may be formed of an insulating material, such as silicon oxide and/or silicon nitride.

A lower insulating layer 648 may be formed on the substrate 600 having the spacers 635. The lower insulating layer 648 may include a first insulating layer 642, a second insulating layer 644, and a third insulating layer 646 stacked sequentially. The second insulating layer 644 may be formed of silicon nitride, while the first and third insulating layers 642 and 646 may be formed of silicon oxide.

An ion implantation process may be performed on the substrate 600 having the spacers 635 so that first impurity regions 640a may be formed in the first active region 610a adjacent to the conductive pattern 627. Also, a second impurity region 640b may be formed in the second active region 610b.

When the first region CR is a capacitor region and the conductive pattern 627 is an upper electrode of a capacitor, the first and second impurity regions 640a and 640b may have the same conductivity type as the well region 605 and a higher dopant concentration than the well region 605. In another case, when the first region CR is a transistor region and the conductive pattern 627 is used as a gate electrode of a transistor, the first impurity region 640a may have a different conductivity type from the well region 605, and the second impurity region 640b may have the same conductivity type as the well region 605.

Referring to FIG. 21B, a silicon layer 655 may be formed on the substrate 600 having the lower insulating layer 648. A portion of the silicon layer 655 disposed on a top surface of the conductive pattern 627 may have substantially the same thickness as a portion of the silicon layer 655 disposed on the insulating pattern 610s.

Referring to FIG. 21C, the silicon layer 655 may be patterned so that a first semiconductor (e.g., first silicon) pattern 655a may be disposed in the first region CR and overlap the top surface of the conductive pattern 627, and a second semiconductor (e.g., second silicon) pattern 655b may be formed in the second region RR.

The first and second semiconductor (e.g., second silicon) patterns 655a and 655b may have substantially the same thickness in a direction vertical to a surface of the substrate 600. The first semiconductor (e.g., first silicon) pattern 655a may be a floating pattern. The second semiconductor (e.g., second silicon) pattern 655b may be a resistor.

In some example embodiments, the first semiconductor (e.g., first silicon) pattern 655a may be defined as a protection pattern 655a configured to protect the dielectric material 615 from a subsequent plasma process, while the second semiconductor (e.g., second silicon) pattern 655b may be used as a resistor. The dielectric material 615 may be a capacitor dielectric material, the conductive pattern 627 may be an upper electrode of a capacitor, and a portion of the first active region 610a, which may overlap the conductive pattern 627, may be defined as a lower electrode of the capacitor.

An upper insulating layer 680 may be formed on the substrate 600 having the first and second semiconductor (e.g., second silicon) patterns 655a and 655b. The upper insulating layer 680 may include oxide (e.g., an HDP oxide) formed using plasma. The first semiconductor (e.g., first silicon) pattern 655a may prevent or inhibit the dielectric material 615 from being damaged by UV light or charges generated during a plasma process.

Thereafter, a process for forming the plugs and interconnections shown in FIG. 9A may be performed. That is, a first contact plug 690 may be formed through the upper and lower insulating layers 680 and 648 and the capping pattern 630 and electrically connected to the upper conductive pattern 627. A second contact plug 691 may be formed through the upper and lower insulating layers 680 and 648 and electrically connected to the second impurity region 640b. Third contact plugs 692 may be formed through the upper insulating layer 680 and electrically connected to the second semiconductor (e.g., second silicon) pattern 655b. The third contact plugs 692 may be in contact with both end portions of the resistor 655b and electrically connected to the resistor 655b.

First through third interconnections 695, 696, and 697 may be formed on the upper insulating layer 680. The first interconnection 695 may cover the first contact plug 690 and be electrically connected to the first contact plug 690. The second interconnection 696 may cover the second contact plug 691 and be electrically connected to the second contact plug 691. The third interconnections 697 may cover the third contact plugs 692 and be electrically connected to the third contact plugs 692.

The first semiconductor (e.g., first silicon) pattern 655a may be surrounded by the lower and upper insulating layers 648 and 680 and floated. A bottom surface of the first semiconductor (e.g., first silicon) pattern 655a may be covered with the lower insulating layer 648, while top and side surfaces of the first semiconductor (e.g., first silicon) pattern 655a may be covered with the upper insulating layer 680. Accordingly, the first semiconductor (e.g., first silicon) pattern 655a may be surrounded by the lower and upper insulating layers 648 and 680 and electrically floated.

The floated first semiconductor (e.g., first silicon) pattern 655a may protect the dielectric material 615 from plasma generated during a process of forming the first through third interconnections 695, 696, and 697. The dielectric material 615 may be a capacitor dielectric material of the capacitor or a gate oxide layer of the MOS transistor. Accordingly, the first semiconductor (e.g., first silicon) pattern 665a may protect the capacitor and/or the MOS transistor from the plasma.

Figure 22A:
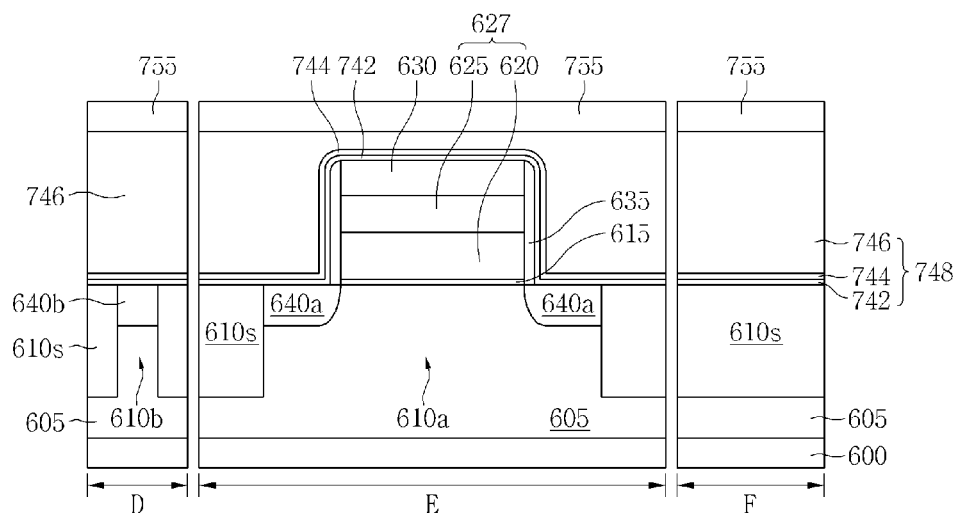
FIGS. 22A and 22B are cross-sectional views of another modified example of a method of fabricating a semiconductor device according to an example embodiment of the inventive concepts.
Figure 22B:
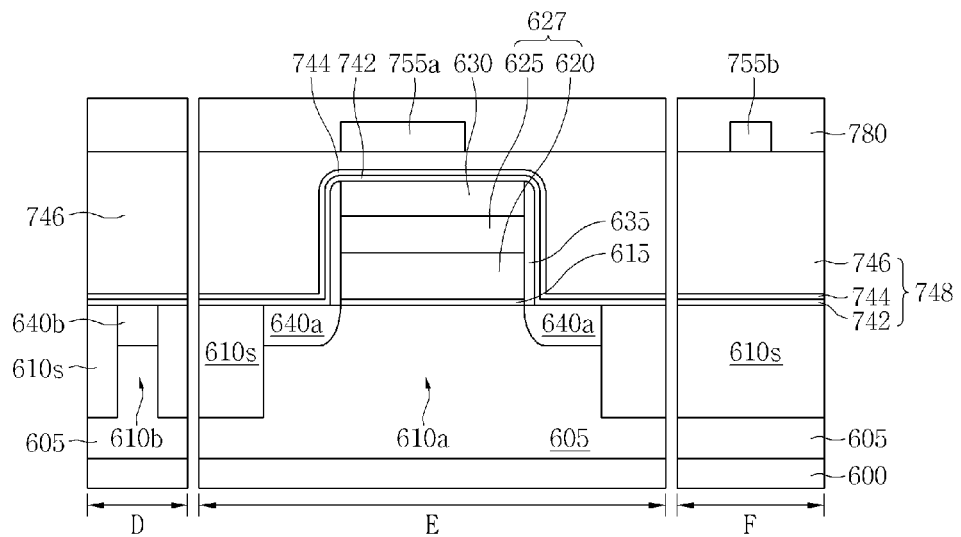

A method of fabricating a semiconductor device according to another modified example of the present embodiment will be described with reference to FIGS. 22A and 22B. FIGS. 22A and 22B are cross-sectional views illustrating a method of fabricating the semiconductor device described with reference to FIG. 9B.

Referring to FIG. 22A, the substrate 600 having the conductive pattern 627, the capping pattern 630, the spacers 635, and the impurity regions 640a and 640b may be prepared as described with reference to FIG. 21A. A lower insulating layer 748 may be formed on the substrate 600. The lower insulating layer 748 may include a first insulating layer 742, a second insulating layer 744, and a third insulating layer 746. The first insulating layer 742 may be conformably formed on the substrate 600 having the spacers 635 and the impurity regions 640a and 640b. The second insulating layer 744 may be conformably formed on the first insulating layer 742. The third insulating layer 746 may be formed on the second insulating layer 742 and have a substantially planar top surface. The second insulating layer 744 may include silicon nitride, while the first and third insulating layers 742 and 746 may include silicon oxide. The third insulating layer 746 may be oxide formed using a non-plasma process. For example, the third insulating layer 746 may include a USG layer. A silicon layer 755 may be formed on the lower insulating layer 748.

Referring to FIG. 22B the silicon layer 755 may be patterned so that a first semiconductor (e.g., first silicon) pattern 755a may be formed in the first region CR and a second semiconductor (e.g., second silicon) pattern 755b may be formed in the second region RR. The first and second semiconductor (e.g., second silicon) patterns 755a and 755b may have substantially the same vertical thickness. The first and second semiconductor (e.g., second silicon) patterns 755a and 755b may be formed at substantially the same level. As described with reference to FIG. 24I, the first semiconductor (e.g., first silicon) pattern 755a may be a pattern configured to protect the dielectric material 615, while the second semiconductor (e.g., second silicon) pattern 755b may be a resistor. The first semiconductor (e.g., first silicon) pattern 755a may be electrically floated. An upper insulating layer 780 may be formed on the substrate 600 having the first and second semiconductor (e.g., second silicon) patterns 755a and 755b.

Thereafter, a process for forming the plugs and interconnections shown in FIG. 9B may be performed. That is, a first contact plug 690 may be formed through the upper and lower insulating layers 780 and 748 and the capping pattern 630 and electrically connected to the conductive pattern 627. A second contact plug 691 may be formed through the upper and lower insulating layers 780 and 748 and electrically connected to the second impurity region 640b. Third contact plugs 692 may be formed through the upper insulating layer 780 and electrically connected to the second semiconductor (e.g., second silicon) pattern 755b. First through third interconnections 695, 696, and 697 may be formed on the upper insulating layer 780. The first interconnection 695 may cover the first contact plug 690 and be electrically connected to the first contact plug 690, and the second interconnection 696 may cover the second contact plug 691 and be electrically connected to the second contact plug 691. The third interconnections 697 may cover the third contact plugs 692 and be electrically connected to the third contact plugs 692.

Figure 23:
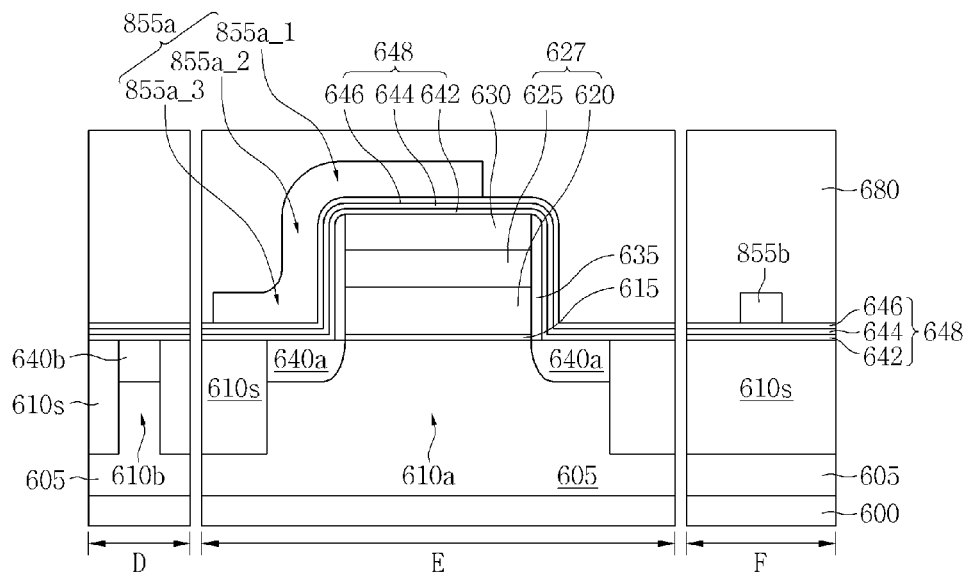
FIG. 23 is a cross-sectional view of another modified example of a method of fabricating a semiconductor device according to an example embodiment of the inventive concepts.

A method of fabricating a semiconductor according to another modified example of the present embodiment will be described with reference to FIG. 23. FIG. 23 is a cross-sectional view illustrating a method of fabricating the semiconductor device described with reference to FIG. 11A.

Referring to FIG. 23, a substrate 600 on which the silicon layer 655 is formed may be prepared as described with reference to FIG. 21B. Thereafter, the silicon layer 655 may be patterned so that a first semiconductor (e.g., first silicon) pattern 855a may be formed in the first region CR, and a second semiconductor (e.g., second silicon) pattern 855b may be formed in the second region RR. The first semiconductor (e.g., first silicon) pattern 855a may be electrically floated. The first semiconductor (e.g., first silicon) pattern 855a may be a protection pattern, while the second semiconductor (e.g., second silicon) pattern 855b may be a resistor.

The first semiconductor (e.g., first silicon) pattern 855a may include a first portion 855a_1 and a second portion

855a_2. The first portion 855a_1 may vertically overlap a top surface of the conductive pattern 627. The second portion 855a_2 may extend from the first portion 855a_1 and horizontally overlap a side surface of the conductive pattern 627. Furthermore, the first semiconductor (e.g., first silicon) pattern 855a may include a third portion 855a_3, which may extend from the second portion 855a_2 onto a top surface of the first active region 610a and/or a top surface of the insulating pattern 610s.

The third portion 855a_3 of the first semiconductor (e.g., first silicon) pattern 855a may be disposed at substantially the same level as the second semiconductor (e.g., second silicon) pattern 855b. The first portion 855a_1 of the first semiconductor (e.g., first silicon) pattern 855a may be disposed at a higher level than the second semiconductor (e.g., second silicon) pattern 855b.

An upper insulating layer 680 may be formed on the substrate 600 having the first and second semiconductor (e.g., second silicon) patterns 855a and 855b.

Subsequently; as shown in FIG. 11A, plugs 690, 691, and 692 and interconnections 695, 696 and 697 may be formed and electrically connected to the conductive pattern 627, the second impurity region 640b, and the second semiconductor (e.g., second silicon) pattern 855b.

Figure 24:
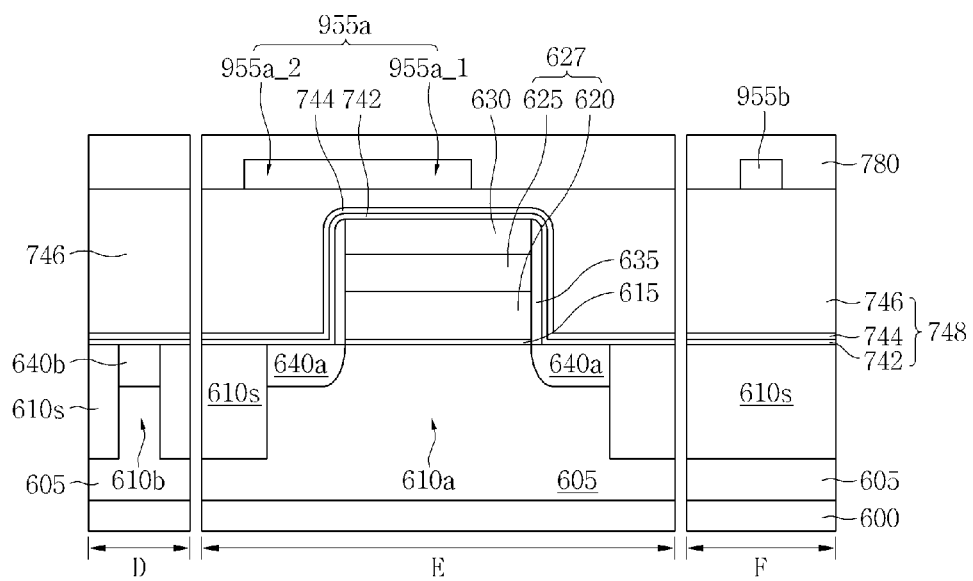
FIG. 24 is a cross-sectional view of another modified example of a method of fabricating a semiconductor device according to an example embodiment of the inventive concepts.

A method of fabricating a semiconductor device according to another modified example of the present embodiment will be described with reference to FIG. 24. FIG. 24 is a cross-sectional view illustrating a method of fabricating the semiconductor device described with reference to FIG. 11B.

Referring to FIG. 24, a substrate 600 on which the silicon layer 755 is formed may be prepared as described with reference to FIG. 22A. The silicon layer 755 may be patterned so that a first semiconductor (e.g., first silicon) pattern 955a may be formed in the first region CR, and a second semiconductor (e.g., second silicon) pattern 955b may be formed in the second region RR. The first semiconductor (e.g., first silicon) pattern 955a may include a first portion 955a_1 and a second portion 955a_2. The first portion 955a_1 may vertically overlap a top surface of the conductive pattern 627. The second portion 955a_2 may extend from the first portion 955a_1 and may not vertically overlap the top surface of the conductive pattern 627. The first semiconductor (e.g., first silicon) pattern 955a may be a protection pattern configured to protect the dielectric material 615, while the second semiconductor (e.g., second silicon) pattern 955b may be a resistor. Thereafter, an upper insulating layer 780 may be formed on the substrate 600 having the first and second semiconductor (e.g., second silicon) patterns 955a and 955b.

As shown in FIG. 11B, plugs 690, 691, and 692 and interconnections 695, 696, and 697 may be formed and electrically connected to the conductive pattern 627, the second impurity region 640b, and the second semiconductor (e.g., second silicon) pattern 955b.

Figure 25:
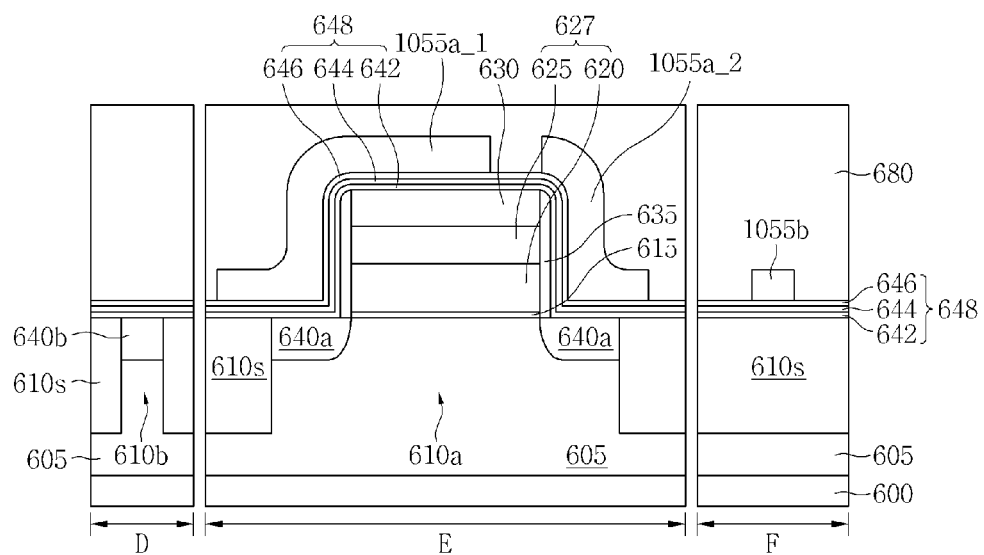
FIG. 25 is a cross-sectional view of another modified example of a method of fabricating a semiconductor device according to an example embodiment of the inventive concepts.

A method of fabricating a semiconductor device according to another modified example of the present embodiment will be described with reference to FIG. 25. FIG. 25 is a cross-sectional view illustrating a method of fabricating the semiconductor device described with reference to FIG. 13A.

Referring to FIG. 25, a substrate 600 on which the silicon layer 655 is formed may be prepared as described with reference to FIG. 21B. Thereafter, the silicon layer 655 may be patterned so that a first semiconductor (e.g., first silicon) pattern 1055a may be formed in the first region CR, and a second semiconductor (e.g., second silicon) pattern 1055b may be formed in the second region RR.

The first semiconductor (e.g., first silicon) pattern 1055a may include a first pattern 1055a_1, a second pattern 1055a_2, and a third pattern 1055a_3.

From a plan view, the first pattern 1055a_1 may run across a middle portion of the conductive pattern 627, while the second and third patterns 1055a_2 and 1055a_3 may be formed to cover corners of the conductive pattern 627.

From a plan view, since shapes of the first through third patterns 1055a_1, 1055a_2, and 1055a_3, and an arrangement relationship among the first through third patterns 1055a_1, 1055a_2, and 1055a_3 are substantially the same as the first through third patterns 470a_1, 470a_2, and 470a_3 described with reference to FIG. 19, a detailed description thereof will be omitted.

An upper insulating layer 680 may be formed on the substrate 600 having the first through third patterns 1055a_1, 1055a_2, and 1055a_3 and the resistor 1055b.

Thereafter, as shown in FIG. 13A, plugs 690, 691, and 692 and interconnections 695, 696, and 697 may be formed and electrically connected to the conductive pattern 627, the second impurity region 640b, and the second semiconductor (e.g., second silicon) pattern 1055b.

Figure 26:
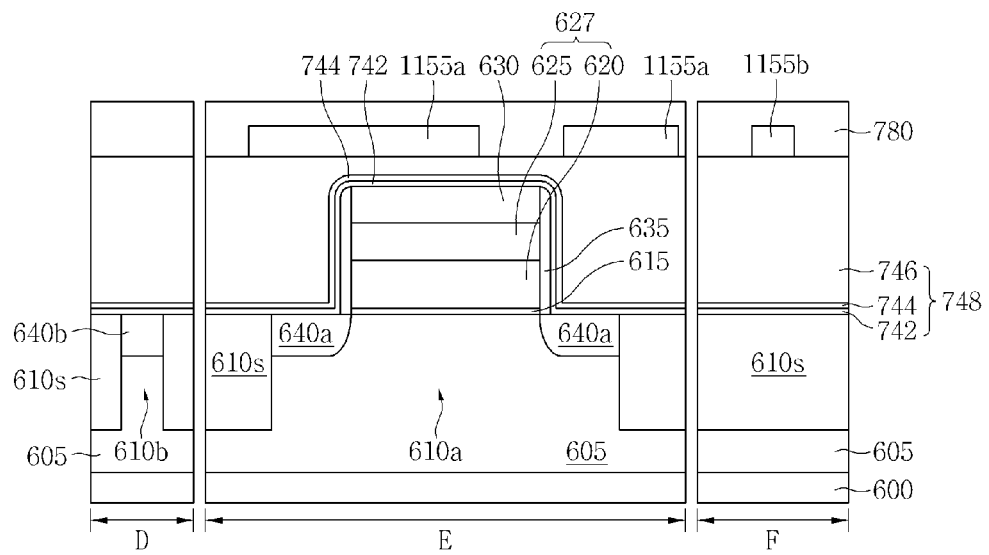
FIG. 26 is a cross-sectional view of another modified example of a method of fabricating a semiconductor device according to an example embodiment of the inventive concepts.

A method of fabricating a semiconductor device according to another modified example of the present embodiment will be described with reference to FIG. 26. FIG. 26 is a cross-sectional view illustrating a method of fabricating the semiconductor device described with reference FIG. 13B.

Referring to FIG. 26, a substrate 600 on which the silicon layer 755 is formed may be prepared as described with reference to FIG. 22A. The silicon layer 755 may be patterned so that a first semiconductor (e.g., first silicon) pattern 1155a may be formed in the first region CR, and a second semiconductor (e.g., second silicon) pattern 1155b may be formed in the second region RR. The first and second semiconductor (e.g., second silicon) patterns 1155a and 1155b may be formed at substantially the same level to the same thickness.

From a plan view, the first semiconductor (e.g., first silicon) pattern 1155a may include first through third patterns having substantially the same planar shapes and planar arrangement relationship as the first through third patterns 1055a_1, 1055a_2, and 1055a_3 described with FIG. 13A. Since the first semiconductor (e.g., first silicon) pattern 1155a has substantially the same planar shape and planar arrangement relationship as the first semiconductor (e.g., first silicon) pattern 1055a described with reference to FIG. 13A, a detailed description thereof will be omitted.

An upper insulating layer 780 may be formed on the substrate 600 having the first and second semiconductor (e.g., second silicon) patterns 1155a and 1155b.

Thereafter, as shown in FIG. 13B, plugs 690, 691, and 692 and interconnections 695, 696, and 697 may be formed and electrically connected to the conductive pattern 627, the second impurity region 640b, and the second semiconductor (e.g., second silicon) pattern 1155b.

According to some example embodiments, a semiconductor device including a dielectric material and a conductive pattern sequentially stacked on an active region may be provided. The dielectric material and the conductive pattern may constitute a transistor or a capacitor. A protection pattern may be provided on the conductive pattern and spaced apart from the conductive pattern. The protection pattern may serve to protect the capacitor and/or the transistor from plasma generated during a subsequent process. For instance, the protection pattern may serve to protect a capacitor dielectric material or a gate oxide layer of the transistor from plasma generated during a subsequent process. Furthermore, since the protection pattern is formed simultaneously with a resistor, an additional process and cost for forming the protection pattern are not required. Accordingly, a structure of a semiconductor device and a method of fabricating the same, which may improve yield without increasing production costs, may be provided.

Figure 27:
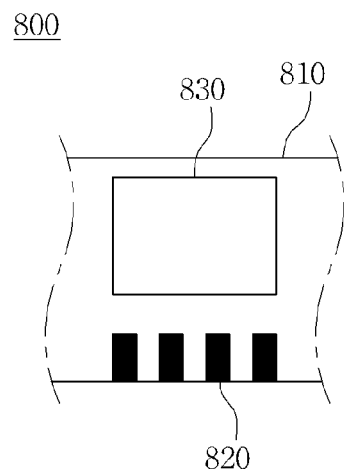
FIG. 27 is a schematic view of a memory card including a semiconductor device according to an example embodiment of the inventive concepts.

FIG. 27 is a schematic view of a memory card including a semiconductor device according to an example embodiment of the inventive concepts. Referring to FIG. 27, a memory card 800 may include a card substrate 810, one semiconductor device or a plurality of semiconductor devices 830 disposed on the card substrate 810, and contact terminals 820 formed in a row on one edge of the card substrate 810 and electrically connected to the semiconductor devices 830, respectively. Here, each of the semiconductor devices 830 may be a memory chip or semiconductor package including one of the above-described semiconductor devices according to one embodiment of the inventive concepts and modified examples thereof. The memory card 800 may be a memory card used for an electronic device, such as a digital camera, a computer, or a portable storage device.

The card substrate 810 may be a printed circuit board (PCB). Both surfaces of the card substrate 810 may be used. That is, the semiconductor devices 830 may be disposed on front and rear surfaces of the card substrate 810. The semiconductor devices 830 disposed on the front surface and/or rear surface of the card substrate 810 may be electrically or mechanically connected to the card substrate 810.

The contact terminals 820 may be formed of a metal and have oxidation resistance. The contact terminals 820 may be variously determined according to the kind and standards of the memory card 800. Therefore, the number of the shown contact terminals 820 is not particularly significant.

Figure 28:
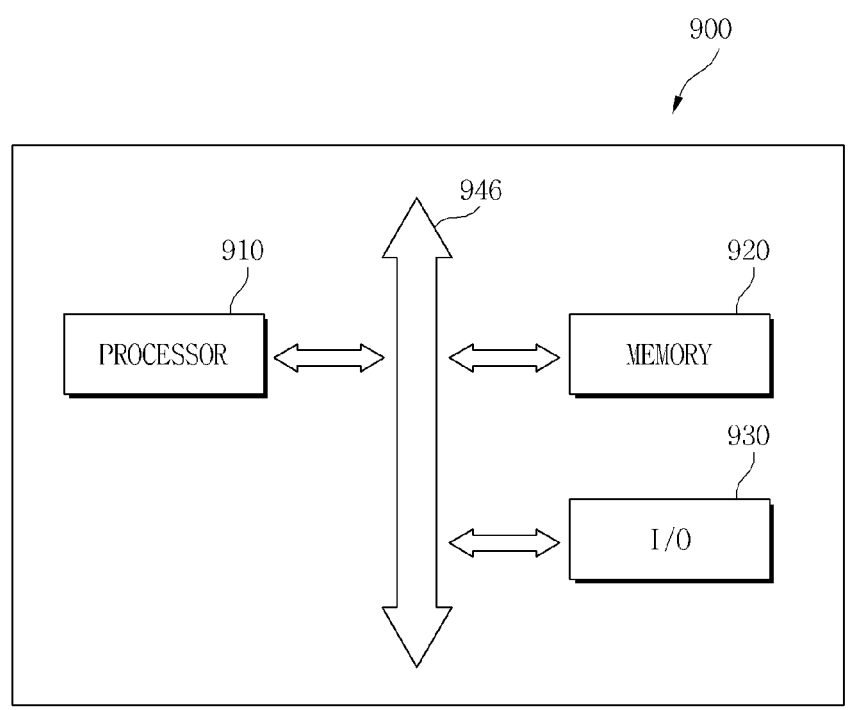
FIG. 28 is a block diagram of an electronic system including a semiconductor device according to an example embodiment of the inventive concepts.

FIG. 28 is a block diagram of an electronic system including a semiconductor device according to an example embodiment of the inventive concepts.

Referring to FIG. 28, an electronic system 900 may be provided. The electronic system 900 may include a processor 910, a memory 920, and an input/output (I/O) device 930. The processor 910, the memory 920, and the I/O device 930 may be connected through a bus 946.

The memory 920 may receive control signals, such as RAS*, WE*, and CAS*, from the processor 910. The memory 920 may store codes and data for operations of the processor 910. The memory 920 may be used to store data accessed through the bus 946.

The memory 920 may include a memory device having any one of the semiconductor devices according to one embodiment of the inventive concepts and modified examples thereof. For specific realization and modification of the inventive concepts, additional circuits and control signals may be provided.

The electronic system 900 may constitute various electronic control systems that may require the memory 920. For example, the electronic system 900 may be used for a computer system, a wireless communication system (e.g., a personal digital assistant (PDA), a laptop computer, a portable computer, a web tablet, a wireless phone, a portable phone, a digital music player, an MP3 player, a navigation, a solid-state disk (SSD), or a household appliance), or any device capable of transceiving information in wireless environments.

Specifically embodied and modified examples of the electronic system 900 will now be described with reference to FIGS. 29 and 30.

Figure 29:
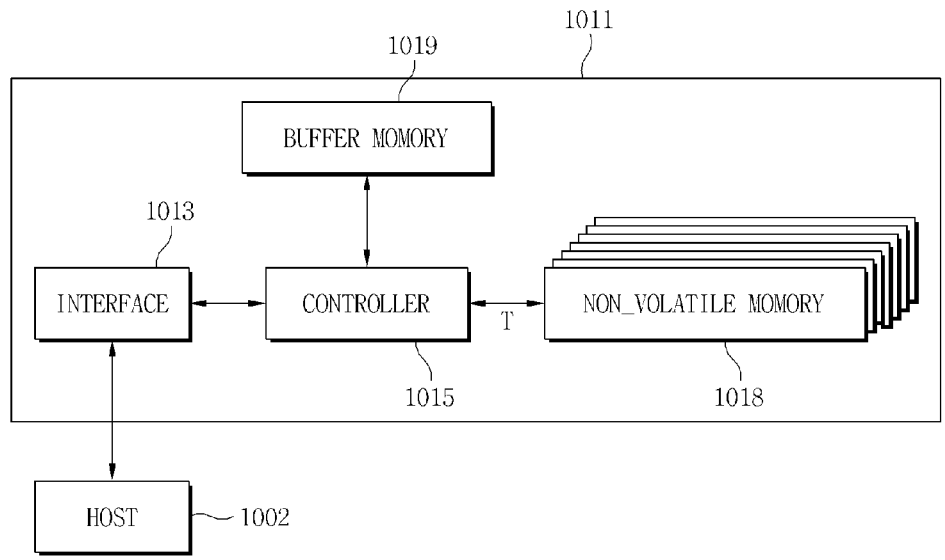
FIG. 29 is a block diagram of a data storage device including a semiconductor device according to an example embodiment of the inventive concepts.

FIG. 29 is a block diagram of a data storage device including a semiconductor device according to an example embodiment of the inventive concepts.

Referring to FIG. 29, an electronic device may be a data storage device, such as an SSD 1011. The SSD 1011 may include an interface 1013, a controller 1015, a non-volatile memory 1018, and a buffer memory 1019.

The SSD 1011 may store information using a semiconductor device. As compared with a hard disk drive (HDD), the SSD 1011 may operate at high speed, reduce mechanical delay, failure rate, generation of heat, and noise, and be downscaled and made lightweight. The SSD 1011 may be widely used for laptop personal computers (laptop PCs), netbooks, desktop PCs, MP3 players, or portable storage devices.

The controller 1015 may be formed adjacent to and electrically connected to the interface 1013. The controller 1015 may be a microprocessor (MP) including a memory controller and a buffer controller. The non-volatile memory 1018 may be formed adjacent to and electrically connected to the controller 1015 through a connection terminal T. The SSD 1011 may have a data capacity corresponding to the non-volatile memory 1018. The buffer memory 1019 may be formed adjacent to and electrically connected to the controller 1015.

The interface 1013 may be connected to a host 1002 and serve to transmit and receive electric signals, such as data. For example, the interface 1013 may be an apparatus using a standard, such as serial advanced technology attachment (SATA), integrated drive electronics (IDE), small computer system interface (SCSI), and/or a combination thereof. The non-volatile memory 1018 may be connected to the interface 1013 through the controller 1015.

The non-volatile memory 1018 may function to store data received through the interface 1013. The non-volatile memory 1018 may include a semiconductor device according to an example embodiment of the inventive concepts.

Even if power supplied to the SSD 1011 is interrupted, the non-volatile memory 1018 may be characterized by retaining the stored data.

The buffer memory 1019 may include a volatile memory device. The volatile memory device may be a dynamic random access memory (DRAM) and/or a static random access memory (SRAM). The buffer memory 1019 may operate at higher speed than the non-volatile memory device 1018.

Data processing speed of the interface 1013 may be higher than operation speed of the non-volatile memory device 1018. Here, the buffer memory 1019 may function to temporarily store data. After data received through the interface 1013 is temporarily stored in the buffer memory 1019 through the controller 1015, the received data may be permanently stored in the non-volatile memory 1018 at a data write speed of the non-volatile memory 1018. Also, among the data stored in the non-volatile memory 1018, frequently used data may be previously read and temporarily stored in the buffer memory 1019. That is, the buffer memory 1019 may function to increase effective operating speed of the SSD 1011 and reduce error rate.

Figure 30:
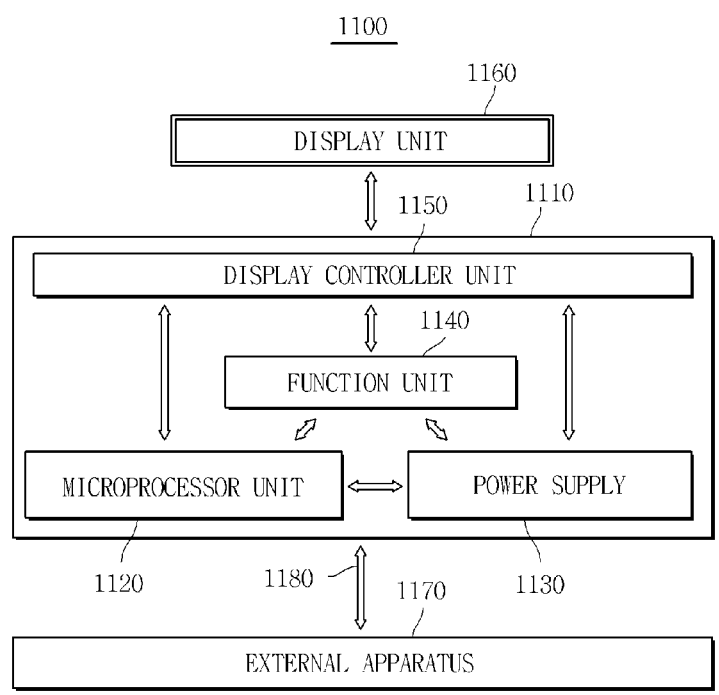
FIG. 30 is a block diagram of an electronic device including a semiconductor device according to an example embodiment of the inventive concepts.

FIG. 30 is a block diagram of an electronic device including a semiconductor device according to an example embodiment of the inventive concepts.

Referring to FIG. 30, a semiconductor device according to an example embodiment of the inventive concepts may be applied to an electronic system 1100. The electronic system 1100 may include a body 1110, an MP unit 1120, a power supply 1130, a function unit 1140, and a display controller unit 1150. The body 1110 may be a mother board including a PCB. The MP unit 1120, the power supply 1130, the function unit 1140, and the display controller unit 1150 may be mounted on the body 1110. The display unit 1160 may be disposed inside or outside the body 1110. For example, the display unit 1160 may be disposed on a surface of the body 1110 and display an image processed by the display controller unit 1150.

The power supply 1130 may function to receive a given (or alternatively, predetermined) voltage from an external battery (not shown), divide the voltage into required voltage levels, and supply the divided voltages to the MP unit 1120, the function unit 1140, and the display controller unit 1150. The MP unit 1120 may receive a voltage from the power supply 1130 and control the function unit 1140 and the display unit 1160. The function unit 1140 may serve various functions of the electronic system 1100. For example, when the electronic system 1100 is a portable phone, the function unit 1140 may include several components capable of serving various functions of the portable phone, for example, outputting an image to the display unit 1160 or outputting a voice to a speaker, by dialing or communicating with an external apparatus 1170. When a camera is also mounted, the function unit 1140 may serve as a camera image processor.

In some example embodiments, when the electronic system 1100 is connected to a memory card to increase capacity, the function unit 1140 may be a memory card controller. The function unit 1140 may transmit/receive signals to/from the external apparatus 1170 through a wired or wireless communication unit 1180. Furthermore, when the electronic system 1100 requires a universal serial bus (USB) to increase functionality, the function unit 1140 may serve as an interface controller. A semiconductor device according to an example embodiment of the inventive concepts may be applied to at least one of the MP unit 1120 and the function unit 1140.

The foregoing is illustrative of example embodiments and is not to be construed as limiting thereof. Although a few example embodiments have been described, those skilled in the art will readily appreciate that many modifications are possible without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures.

What is claimed is:

1. A semiconductor device comprising:
    a semiconductor substrate having a capacitor region and a resistor region;
    a capacitor dielectric material and a capacitor electrode sequentially stacked on an active region of the capacitor region of the semiconductor substrate;
    a resistor on the resistor region of the semiconductor substrate; and
    a protection pattern on a top surface of the capacitor electrode and spaced apart from the capacitor electrode,
    wherein the protection pattern and the resistor include a same material and have a same thickness in a direction vertical to a surface of the semiconductor substrate.

2. The semiconductor device of claim 1, further comprising:
    a lower insulating layer under the protection pattern and the resistor to cover the capacitor electrode; and
    an upper insulating layer on the lower insulating layer to cover the protection pattern and the resistor.

3. The semiconductor device of claim 2, wherein the lower insulating layer covers a bottom surface of the protection pattern, the upper insulating layer covers top and side surfaces of the protection pattern, and the protection pattern electrically floats.

4. The semiconductor device of claim 2, wherein the lower insulating layer includes a first insulating layer, a second insulating layer, and a third insulating layer stacked sequentially, and the second insulating layer includes a different insulating material from the first and third insulating layers.

5. The semiconductor device of claim 1, wherein a top surface of the resistor is at a lower level than the top surface of the capacitor electrode.

6. The semiconductor device of claim 1, wherein the protection pattern has a greater width than the resistor.

7. The semiconductor device of claim 1, wherein the protection pattern includes a first portion covering the top surface of the capacitor electrode, and a second portion extending from the first portion over the semiconductor substrate adjacent to the capacitor electrode.

8. The semiconductor device of claim 1, wherein the protection pattern includes a first portion vertically overlapping the top surface of the capacitor electrode, a second portion over the semiconductor substrate adjacent to the capacitor electrode, and a third portion configured to connect the first and second portions and horizontally overlap a side surface of the capacitor electrode.

9. The semiconductor device of claim 1, wherein the capacitor electrode includes a lower conductive pattern and an upper conductive pattern on the lower conductive pattern, and the upper conductive pattern has a greater planar area than the lower conductive pattern.

10. The semiconductor device of claim 1, further comprising:
    an insulating pattern in the semiconductor substrate having the capacitor region and the resistor region,
    wherein the insulating pattern defines the active region of a capacitor in the capacitor region and is under the resistor in the resistor region.

11. The semiconductor device of claim 10, wherein the capacitor electrode includes a lower conductive pattern and an upper conductive pattern stacked sequentially,
    the lower conductive pattern has a side surface vertically aligned with a side surface of the active region, and
    the upper conductive pattern includes a first portion covering the lower conductive pattern, and a second portion vertically overlapping the insulating pattern adjacent to the lower conductive pattern.

12. A semiconductor device comprising:
    an insulating pattern in a semiconductor substrate and configured to define an active region;
    a dielectric material and a conductive pattern sequentially stacked on the active region;
    a lower insulating layer over a portion of the semiconductor substrate having the insulating pattern and the conductive pattern;
    a first silicon pattern on the lower insulating layer and configured to vertically overlap a top surface of the conductive pattern;
    a second silicon pattern on the lower insulating layer and spaced apart from the first silicon pattern;
    an upper insulating layer on the lower insulating layer and configured to cover the first and second silicon patterns;
    a first interconnection on the upper insulating layer and electrically connected to the conductive pattern; and
    a second interconnection on the upper insulating layer and electrically connected to the second silicon pattern,
    wherein the first and second silicon patterns have a same thickness in a direction vertical to a surface of the semiconductor substrate.

13. The semiconductor device of claim 12, wherein a top surface of the second silicon pattern is at a lower level than a bottom surface of the first silicon pattern.

14. The semiconductor device of claim 12, wherein the first silicon pattern is a pattern encapsulated by the lower and upper insulating layers so as to float electrically.

15. The semiconductor device of claim 12, wherein the lower insulating layer includes a non-plasma oxide, and the upper insulating layer includes a plasma oxide.

16. A semiconductor device comprising:
- a semiconductor substrate including first and second regions;
- a dielectric material and a conductive pattern sequentially stacked on the first region of the semiconductor substrate;
- a first semiconductor pattern on a top surface of the conductive pattern and spaced apart from the conductive pattern, the first semiconductor pattern having a first width; and
- a second semiconductor pattern on the second region of the semiconductor substrate, the second semiconductor pattern having a second width less than the first width, wherein a top surface of the second semiconductor pattern is at a lower level than a bottom surface of the first semiconductor pattern.

17. The semiconductor device of claim 16, wherein the first and second semiconductor patterns include a same material.

18. The semiconductor device of claim 17, wherein the same material is polycrystalline silicon.

19. The semiconductor device of claim 16, wherein the first and second semiconductor patterns have a same thickness in a direction vertical to a surface of the semiconductor substrate.

\* \* \* \* \*